United States Patent
Yang et al.

(10) Patent No.: US 11,935,585 B2
(45) Date of Patent: Mar. 19, 2024

(54) PSEUDO MULTI-PLANE READ METHODS AND APPARATUS FOR NON-VOLATILE MEMORY DEVICES

(71) Applicant: SanDisk Technologies LLC, Addison, TX (US)

(72) Inventors: Xiang Yang, Santa Clara, CA (US); Arka Ganguly, Scotts Valley, CA (US); Ohwon Kwon, Pleasanton, CA (US)

(73) Assignee: SanDisk Technologies LLC, Addison, TX (US)

( * ) Notice: Subject to any disclaimer, the term of this patent is extended or adjusted under 35 U.S.C. 154(b) by 232 days.

(21) Appl. No.: 17/509,725

(22) Filed: Oct. 25, 2021

(65) Prior Publication Data

US 2023/0131500 A1   Apr. 27, 2023

(51) Int. Cl.
| | |
|---|---|
| *G11C 11/4096* | (2006.01) |
| *G06F 3/06* | (2006.01) |
| *G11C 11/4074* | (2006.01) |
| *G11C 11/408* | (2006.01) |

(52) U.S. Cl.
CPC ........ *G11C 11/4096* (2013.01); *G06F 3/0613* (2013.01); *G06F 3/064* (2013.01); *G06F 3/0659* (2013.01); *G06F 3/0679* (2013.01); *G11C 11/4074* (2013.01); *G11C 11/4085* (2013.01)

(58) Field of Classification Search
CPC ............ G11C 11/4096; G11C 11/4074; G11C 11/4085; G11C 16/26; G11C 16/32; G11C 16/08; G06F 3/0613; G06F 3/064; G06F 3/0659; G06F 3/0679
See application file for complete search history.

(56) References Cited

U.S. PATENT DOCUMENTS

| | | | |
|---|---|---|---|
| 2016/0070507 A1* | 3/2016 | Hoshikawa | G06F 3/0644 711/149 |
| 2020/0104071 A1* | 4/2020 | Sallese | G06F 3/0658 |
| 2023/0195475 A1* | 6/2023 | Basso | G06F 12/02 713/2 |

OTHER PUBLICATIONS

Jae-Woo Park, "A 176-Stacked 512Gb 3b/Cell 3D-NAND Flash with 10.8Gb/mm2 Density with a Peripheral Circuit Under Cell Array Architecture", IEEE International Solid-State Circuits Conference 2021, Feb. 18, 2021.

* cited by examiner

*Primary Examiner* — Sultana Begum

(74) *Attorney, Agent, or Firm* — Vierra Magen Marcus LLP

(57) ABSTRACT

An apparatus includes a control circuit and a plurality of non-volatile memory cells arranged in a plane of a memory die. The plane includes a first word line including a first word line portion coupled to a corresponding first group of the non-volatile memory cells, and a second word line including a second word line portion coupled to a corresponding second group of the non-volatile memory cells, the second word line different from the first word line. The control circuit is configured to apply a first voltage to the first word line portion and apply a second voltage to the second word line portion to concurrently read the first group of the non-volatile memory cells and the second group of the non-volatile memory cells. The first group of the non-volatile memory cells and the second group of the non-volatile memory cells each store less than a page of data.

20 Claims, 9 Drawing Sheets

PSEUDO MULTI-PLANE READ METHODS AND APPARATUS FOR NON-VOLATILE MEMORY DEVICES

BACKGROUND

This application relates to semiconductor memory and, more particularly, to non-volatile memory.

Semiconductor memory is widely used in various electronic devices such as cellular telephones, digital cameras, personal digital assistants, medical electronics, mobile computing devices, laptop computers, desktop computers, servers, solid state drives, non-mobile computing devices and other devices. Semiconductor memory may include non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Input/output operations per second (IOPS) is a performance measurement used to characterize memory systems. Random IOPS (accessing locations on a storage device in a non-contiguous manner) is one benchmark commonly used to categorize removable memory devices. It is desirable for memory systems to have high random IOPS.

BRIEF DESCRIPTION OF THE DRAWINGS

Like-numbered elements refer to common components in the different figures.

DETAILED DESCRIPTION

Technology is described to improve random read processing bandwidth without increasing the number of planes per memory die. In particular, the described technology concurrently reads portions of pages of data from each of separate blocks of memory cells within the same plane.

In one embodiment, data are concurrently read from a first portion of a first page of data from a first block of a plane and from a second portion of a second page of data from a second block of the plane. In an embodiment, the first portion of the first page of data contains data requested in first random read request, and the second portion of the second page of data contains data requested in second random read request. By concurrently reading the first portion and the second portion from two separate blocks of the same plane, the random read processing bandwidth effectively doubles. So for random read commands, a four plane memory die operates like an eight plane memory die in terms of random read bandwidth.

In another embodiment, data are concurrently read from a first portion of a first page of data from a first block of a plane, from a second portion of a second page of data from a second block of the plane, from a third portion of a third page of data from a third block of the plane, and from a fourth portion of a fourth page of data from a fourth block of the plane. In an embodiment, the first portion of the first page of data contains data requested in first random read request, the second portion of the second page of data contains data requested in second random read request, the third portion of the third page of data contains data requested in third random read request, and the fourth portion of the fourth page of data contains data requested in fourth random read request. By concurrently reading the first portion, second portion, third portion and fourth portion from four separate blocks of the same plane, the random read processing bandwidth effectively quadruples. So for random read commands, a four plane memory die operates like a sixteen plane memory die in terms of random read bandwidth.

Figure 1A:
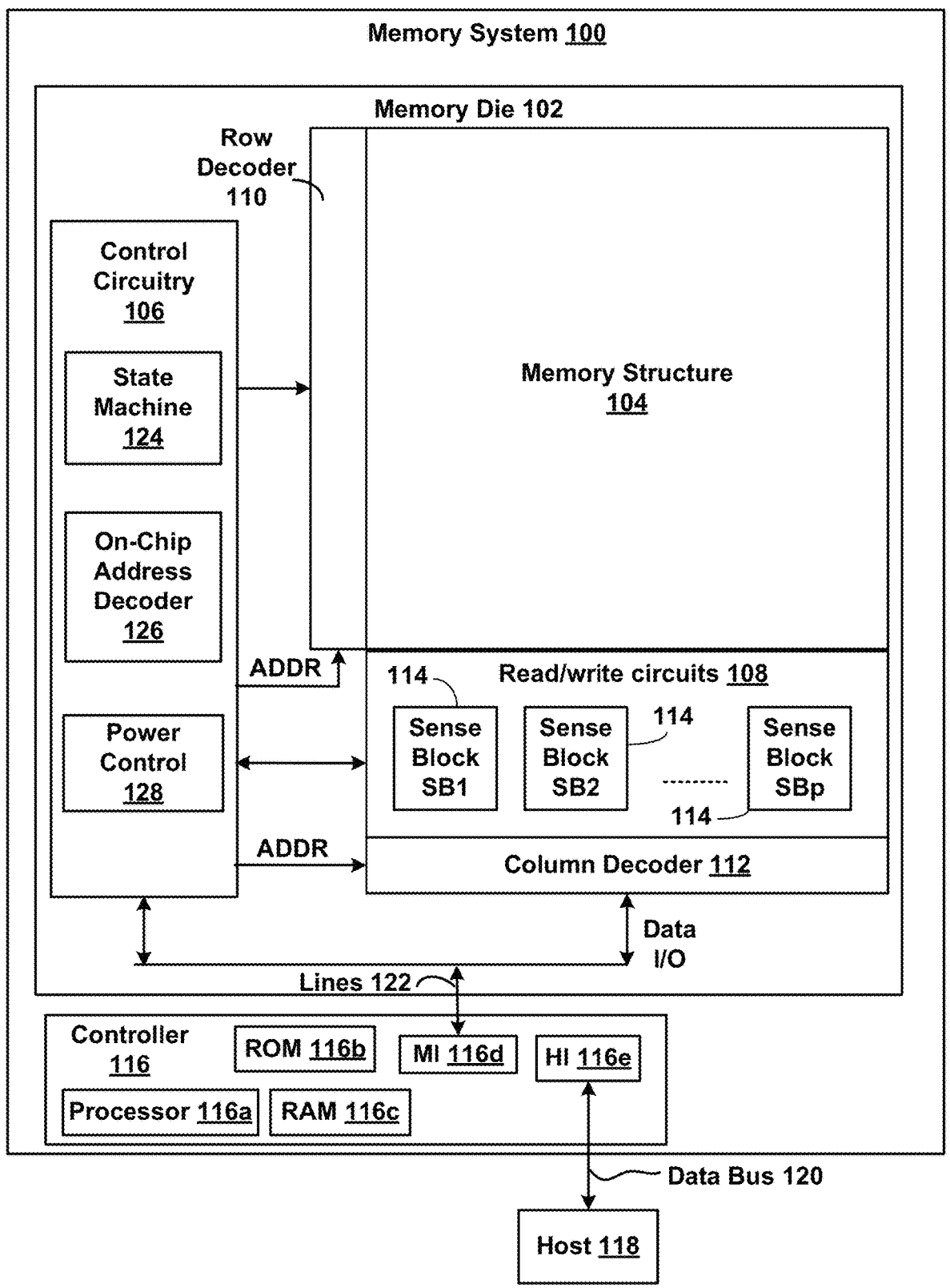
FIG. 1A is a functional block diagram of a memory device.
Figure 1B:
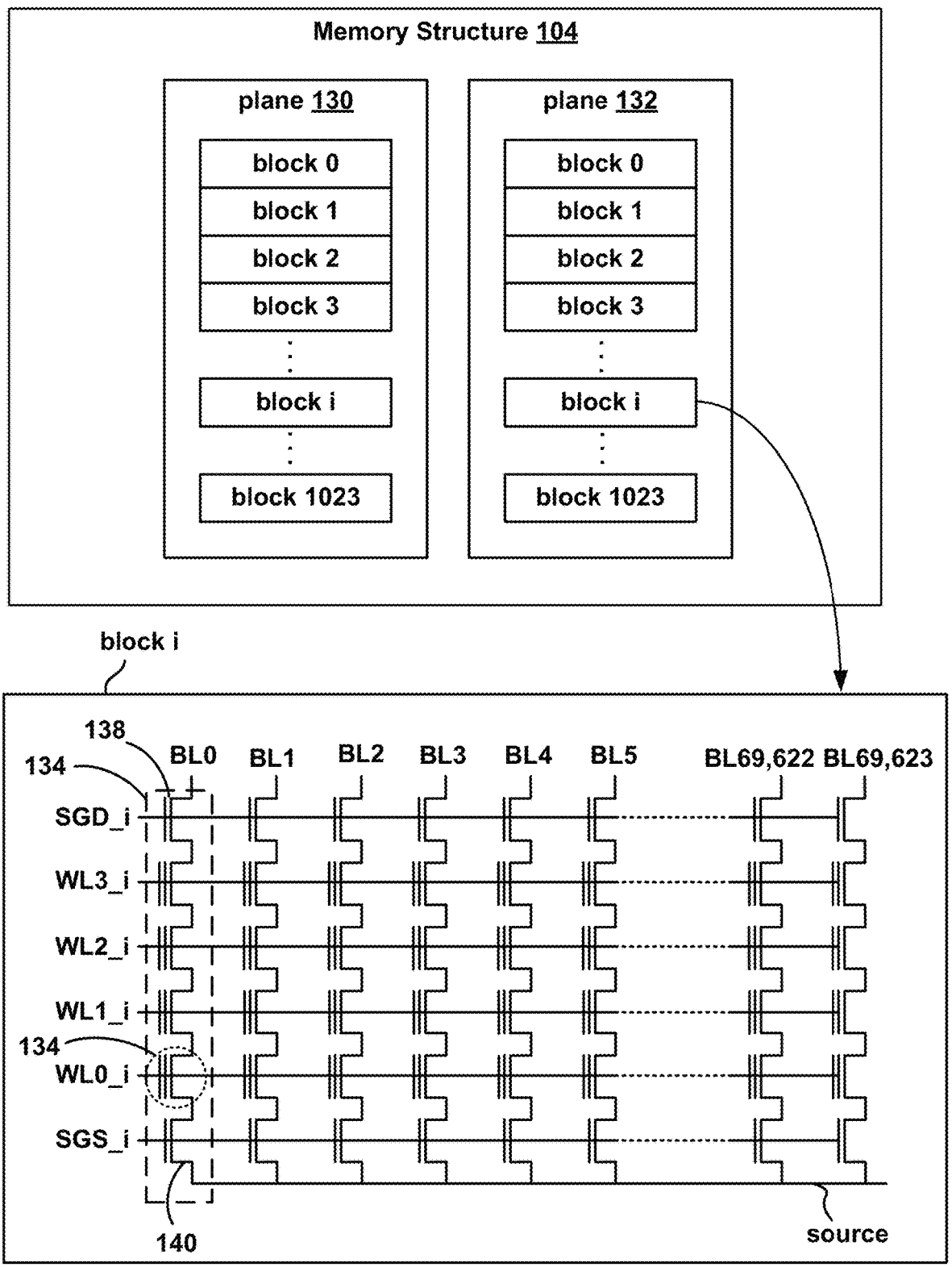
FIG. 1B is a block diagram depicting one example of a memory structure.

FIGS. 1A-1B describe an example memory system that can be used to implement the technology described herein. FIG. 1A is a functional block diagram of an example memory system 100, which includes one or more memory die 102. The components depicted in FIG. 1A are electrical circuits. In an embodiment, each memory die 102 includes a memory structure 104, control circuitry 106, and read/write circuits 108. Memory structure 104 is addressable by word lines via a row decoder 110 and by bit lines via a column decoder 112.

Read/write circuits 108 include multiple sense blocks 114 including SB1, SB2, . . . , SBp (sensing circuitry) and allow a page (or multiple pages) of memory cells to be read or programmed in parallel. In an embodiment, each sense block 114 includes a sense amplifier and a set of latches (not shown) connected to a bit line. The latches store data to be written and/or data that has been read. In an embodiment, the sense amplifiers include bit line drivers.

In some systems, a controller 116 is included in the same package (e.g., a removable storage card) as memory die 102. However, in other systems, controller 116 can be separate from memory die 102. In some embodiments controller 116 will be on a different die than memory die 102. In some embodiments, a single controller 116 will communicate with multiple memory die 102. In other embodiments, each memory die 102 has its own controller. Commands and data are transferred between a host 118 and controller 116 via a data bus 120, and between controller 116 and the one or more memory die 102 via lines 122. In an embodiment, memory die 102 includes a set of input and/or output (I/O) pins (not shown) that connect to lines 122.

Control circuitry 106 cooperates with the read/write circuits 108 to perform memory operations (e.g., write, read, and others) on memory structure 104, and includes a state machine 124, an on-chip address decoder 126, and a power control circuit 128. State machine 124 provides die-level control of memory operations. In an embodiment, state machine 124 is programmable by software. In other embodiments, state machine 124 does not use software and is completely implemented in hardware (e.g., electrical circuits). In an embodiment, control circuitry 106 includes buffers such as registers, ROM fuses and other storage devices (not shown) for storing default values such as base voltages and other parameters.

On-chip address decoder 126 provides an address interface between addresses used by host 118 or controller 116 to the hardware address used by row decoder 110 and column decoder 112. Power control circuit 128 controls the power and voltages supplied to the word lines and bit lines during memory operations. Power control circuit 128 may include charge pumps (not shown) for creating voltages. Sense blocks 114 include bit line drivers (not shown).

State machine 124 and/or controller 116 (or equivalently functioned circuits), can be considered a control circuit that performs the functions described herein. The control circuit can include hardware only or a combination of hardware and software (including firmware). For example, a controller programmed by firmware to perform the functions described herein is one example of a control circuit. A control circuit can include a processor, Field Programmable Gate Array (FGA), Application Specific Integrated Circuit (ASIC), integrated circuit or other type of circuit.

Controller 116 (which in one embodiment is an electrical circuit) may include one or more processors 116a, ROM 116b, RAM 116c, a memory interface (MI) 116d and a host interface (HI) 116e, all of which are interconnected. The storage devices (ROM 116b, RAM 116c) store code (software) such as a set of instructions (including firmware), and one or more processors 116a are operable to execute the set of instructions to provide the functionality described herein. Alternatively or additionally, one or more processors 116a can access code from a storage device in memory structure 104, such as a reserved area of memory cells connected to one or more word lines. RAM 116c can be used to store data for controller 116, including caching program data.

Memory interface 116d, in communication with processor 116a, ROM 116b, and RAM 116c, is an electrical circuit that provides an electrical interface between controller 116 and one or more memory die 102. For example, memory interface 116d can change the format or timing of signals, provide a buffer, isolate from surges, latch I/O, etc. One or more processors 116a can issue commands to control circuitry 106 (or another component of memory die 102) via memory interface 116d. Host interface 116e provides an electrical interface with host 118 via data bus 120 to receive commands, addresses and/or data from host 118 to provide data and/or status to host 118.

In one embodiment, memory structure 104 includes a three dimensional memory array of non-volatile memory cells in which multiple memory levels are formed above a substrate, such as a wafer. Memory structure 104 may include any type of non-volatile memory that are monolithically formed in one or more physical levels of arrays of memory cells having an active area disposed above a silicon (or other type of) substrate. In one example, the non-volatile memory cells include vertical NAND strings with charge-trapping material.

In another embodiment, memory structure 104 includes a two dimensional memory array of non-volatile memory cells. In one example, the non-volatile memory cells are NAND flash memory cells utilizing floating gates. Other types of memory cells (e.g., NOR-type flash memory) also can be used.

The exact type of memory array architecture or memory cell included in memory structure 104 is not limited to the examples above. Many different types of memory array architectures or memory technologies can be used to form memory structure 104. No particular non-volatile memory technology is required for purposes of the embodiments described herein.

Other examples of suitable technologies for memory cells of memory structure 104 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory structure 104 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte.

Magnetoresistive memory (MRAM) stores data by magnetic storage elements. The elements are formed from two ferromagnetic plates, each of which can hold a magnetization, separated by a thin insulating layer. One of the ferromagnetic plates is a permanent magnet set to a particular polarity, whereas the magnetization of the other ferromagnetic plate can be changed to match that of an external field to store memory. A memory device is built from a grid of such memory cells.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light.

A person of ordinary skill in the art will recognize that the technology described herein is not limited to a single specific memory structure, but covers many relevant memory structures within the spirit and scope of the technology as described herein and as understood by one of ordinary skill in the art.

FIG. 1B depicts an example of memory structure 104. In one embodiment, an array of memory cells is divided into multiple planes. In the example of FIG. 1B, memory structure 104 is divided into two planes: plane 130 and plane 132. In other embodiments, more or fewer than two planes can be used. In some embodiments, each plane is divided into multiple blocks (e.g., 1024). In other embodiments, each plane may be divided into more or fewer than 1024 blocks.

In certain memory technologies (e.g., 2D/3D NAND and other types of flash memory), a block is the smallest unit of memory cells for an erase operation. That is, each block contains the minimum number of memory cells that are erased together in a single erase operation. Other units of erase also can be used. In other memory technologies (e.g., MRAM, PCM, etc.) used in other embodiments implementing the technology described herein, memory cells may be overwritten without an erase operation.

Each block includes many memory cells. The design, size, and organization of a block depends on the architecture and design for the memory structure 104. As used herein, a block is a contiguous set of memory cells that share word lines and bit lines. For example, block i of plane 132 of FIG. 1B includes memory cells that share word lines WL0_i, WL1_i, WL2_i and WL3_i and share bit lines BL0-BL69,623.

In one embodiment, a block (e.g., block i of plane 132) contains a set of NAND strings (e.g., NAND string 134) which are accessed via bit lines (e.g., bit lines BL0-BL69, 623) and word lines (WL0, WL1, WL2, WL3). FIG. 1B shows four memory cells (e.g., memory cell 136) connected in series to form a NAND string (e.g., NAND string 134). Although four memory cells are depicted to be included in each NAND string, more or fewer than four memory cells can be used (e.g., 16, 32, 64, 128, 256 or another number or memory cells can be on a NAND string).

One terminal of the NAND string is connected to a corresponding bit line via a drain select transistor (e.g., drain select transistor 138), and another terminal is connected to the source line via a source select transistor (e.g., source select transistor 140). Although FIG. 1B shows that example block i includes 4 word lines and 69,624 bit lines, blocks may include more or fewer than 4 word lines and more or fewer than 69,624 bit lines.

Each block is typically divided into one or more pages. In one embodiment, a page is a unit of programming/writing and a unit of reading. Other units of programming also can be used. In an embodiment, one or more pages of data are typically stored in one row of memory cells. For example, one or more pages of data may be stored in memory cells connected to a common word line. In an embodiment, a page includes data stored in all memory cells connected to a common word line.

A page includes user data and overhead data (also called system data). Overhead data typically includes header information and error correction codes (ECC) that have been calculated from the user data. The controller (or other component) calculates the ECC when data are being written into the array, and also checks the ECC when data are being read from the array.

In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

Figure 2:
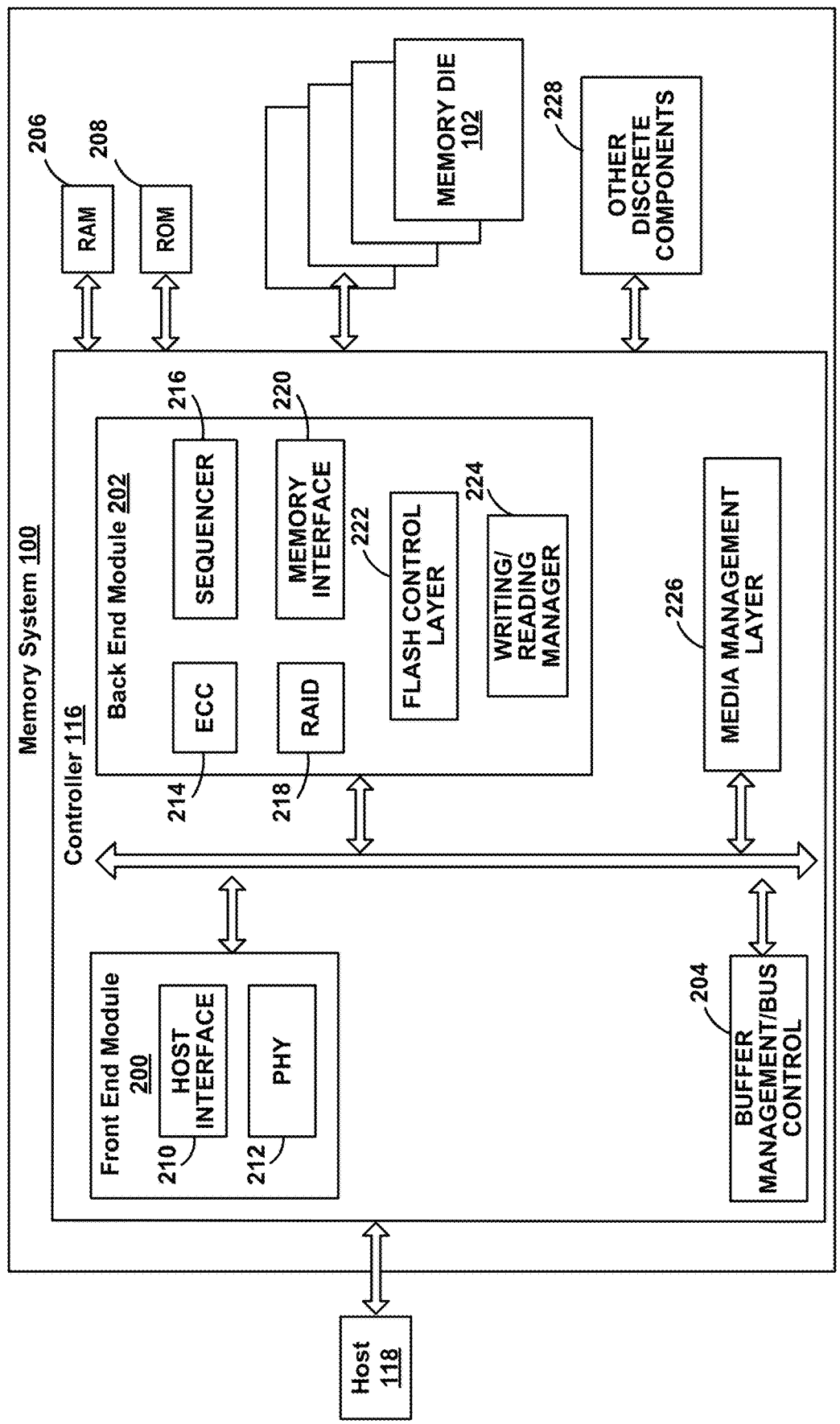
FIG. 2 is a block diagram depicting an embodiment of a memory system.

FIG. 2 is a block diagram of example memory system 100, depicting more details of an embodiment of controller 116. In an embodiment, controller 116 is a flash memory controller. Memory die 102 is not limited to flash memory technology. Thus, controller 116 is not limited to the example of a flash memory controller. As used herein, a flash memory controller is a device that manages data stored in flash memory and communicates with host 118, such as a computer or electronic device.

A flash memory controller can have various functionality in addition to the specific functionality described herein. For example, a flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features.

In operation, when host 118 needs to read data from or write data to memory die 102, host 118 will communicate with controller 116. If host 118 provides a logical address to which data are to be read/written, controller 116 can convert the logical addresses received from host 118 to physical addresses in the flash memory. (Alternatively, host 118 can provide the physical address).

Controller 116 also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 116 and memory die 102 may be any suitable flash interface, such as Toggle Mode 200, 400, or 800. In one embodiment, memory system 100 may be a card based system, such as a secure digital (SD) or a micro secure digital (micro-SD) card. In another embodiment, memory system 100 may be part of an embedded memory system. For example, memory system 100 may be embedded within host 118. In other example, memory system 100 can be in the form of a solid state drive (SSD).

In some embodiments, memory system 100 includes a single channel between controller 116 and memory die 102, although the subject matter described herein is not limited to having a single memory channel. For example, in some memory system architectures, 2, 4, 8 or more channels may exist between controller 116 and memory die 102, depending on controller capabilities. In any of the embodiments described herein, more than a single channel may exist between controller 116 and memory die 102, even if a single channel is shown in the drawings.

The components of controller 116 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example.

For example, each module may include an ASIC, an FPGA, a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 116 to perform the functions described herein. The architecture depicted in FIG. 2 is one example implementation that may (or may not) use the components of controller 116 depicted in FIG. 1A (i.e., RAM, ROM, processor, interface).

Controller 116 includes a front end module 200 that interfaces with host 118, a back end module 202 that interfaces with the one or more memory die 102, and various other modules that perform functions which will now be described in detail. In particular, controller 116 includes a buffer management/bus control 204 that manages buffers in random access memory (RAM) 206 and controls the internal bus arbitration of controller 116. A read only memory (ROM) 208 stores system boot code.

Front end module 200 includes a host interface 210 and a physical layer interface (PHY) 212 that provide the electrical interface with host 118 or next level storage controller. The choice of the type of host interface 210 can depend on the type of memory being used. Examples of host interfaces 210 include, but are not limited to, SATA, SATA Express, SAS, Fibre Channel, USB, PCIe, and NVMe. Host interface 210 typically facilitates transfer for data, control signals, and timing signals.

Back end module 202 includes an ECC engine 214 that encodes data bytes received from host 118, and decodes and error corrects data bytes read from memory die 102. A command sequencer 216 generates command sequences, such as program and erase command sequences, to be transmitted to memory die 102. A RAID (Redundant Array of Independent Dies) module 218 manages generation of RAID parity and recovery of failed data. The RAID parity may be used as an additional level of integrity protection for the data being written into memory system 100. In some cases, RAID module 218 may be a part of ECC engine 214.

A memory interface 220 provides the command sequences to memory die 102 and receives status information from memory die 102. In one embodiment, memory interface 220 may be a double data rate (DDR) interface, such as a Toggle Mode 200, 400, or 800 interface. A flash control layer 222 controls the overall operation of back end module 202.

One embodiment includes a writing/reading manager 224, which can be used to manage (in conjunction with the circuits on memory die 102) the writing and reading of memory cells. In some embodiments, writing/reading manager 224 performs the processes depicted in the flow charts described below.

Additional components of memory system 100 illustrated in FIG. 2 include media management layer (MML) 226, which performs wear leveling of memory cells of memory die 102. Memory system 100 also includes other discrete components 228, such as external electrical interfaces, external RAM, resistors, capacitors, or other components that may interface with controller 116. In alternative embodiments, one or more of physical layer interface 212, RAID module 218, MML 226 and buffer management/bus controller 204 are optional components that are not necessary in controller 116.

The Flash Translation Layer (FTL) or MML 226 may be integrated as part of the flash management that may handle flash errors and interfacing with host 118. In particular, MML 226 may be a module in flash management and may be responsible for the internals of NAND management. In particular, MML 226 may include an algorithm in the memory device firmware which translates writes from host 118 into writes to memory structure 104 of memory die 102.

Controller 116 may interface with one or more memory die 102. In one embodiment, controller 116 and multiple memory die 102 (together comprising memory system 100) implement an SSD, which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 102 connected to one controller 116. However, other embodiments may include multiple memory die 102 in communication with one or more controllers 116. In one example, the multiple memory die 102 can be grouped into a set of memory packages. Each memory package includes one or more memory die 102 in communication with controller 116. In one embodiment, a memory package includes a printed circuit board (or similar structure) with one or more memory die 102 mounted thereon. In some embodiments, a memory package can include molding material to encase the memory die 102 of the memory package. In some embodiments, controller 116 is physically separate from any of the memory packages.

Figure 3:
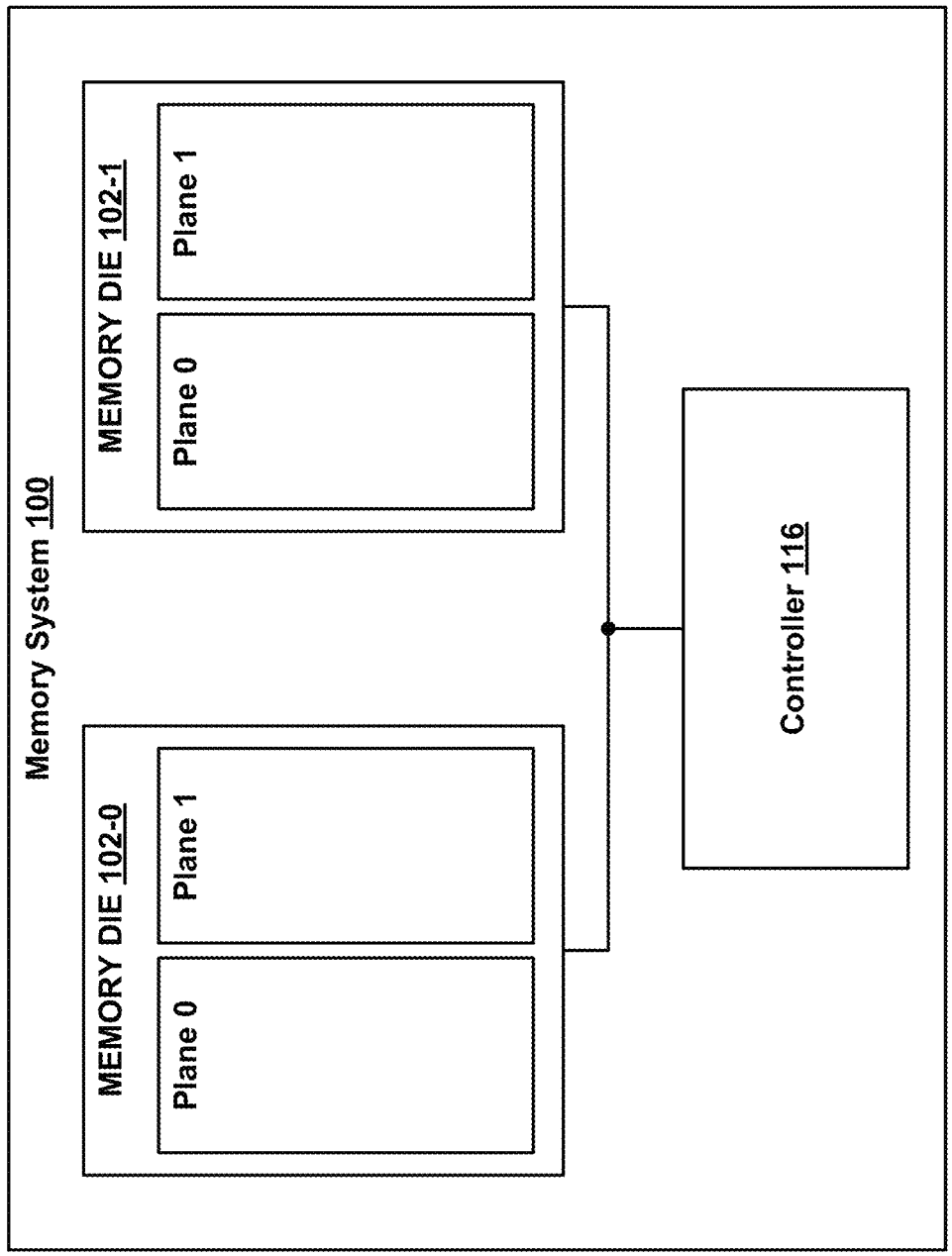
FIG. 3 depicts an embodiment of a multi-plane, multi-die flash memory system.

FIG. 3 shows another embodiment of memory system 100 that includes two memory die (memory die 102-0 and memory die 102-1), each containing two planes (Plane 0 and Plane 1). Each plane has its own bit-line and word-line circuits and is capable of operating substantially independently of other planes. Indeed, to increase parallelism during reading and writing operations, the planes contain their own data registers and other circuits to allow parallel operation such that data may be programmed to or read from each of several or all the planes concurrently.

Controller 116 receives commands from a host (e.g., host 118) and directs the commands to the appropriate location in the nonvolatile memory. In an embodiment, controller 116 converts host commands into instructions that are directed to a particular die, a particular plane of the particular die, and to a particular page within the particular plane.

Figure 4:
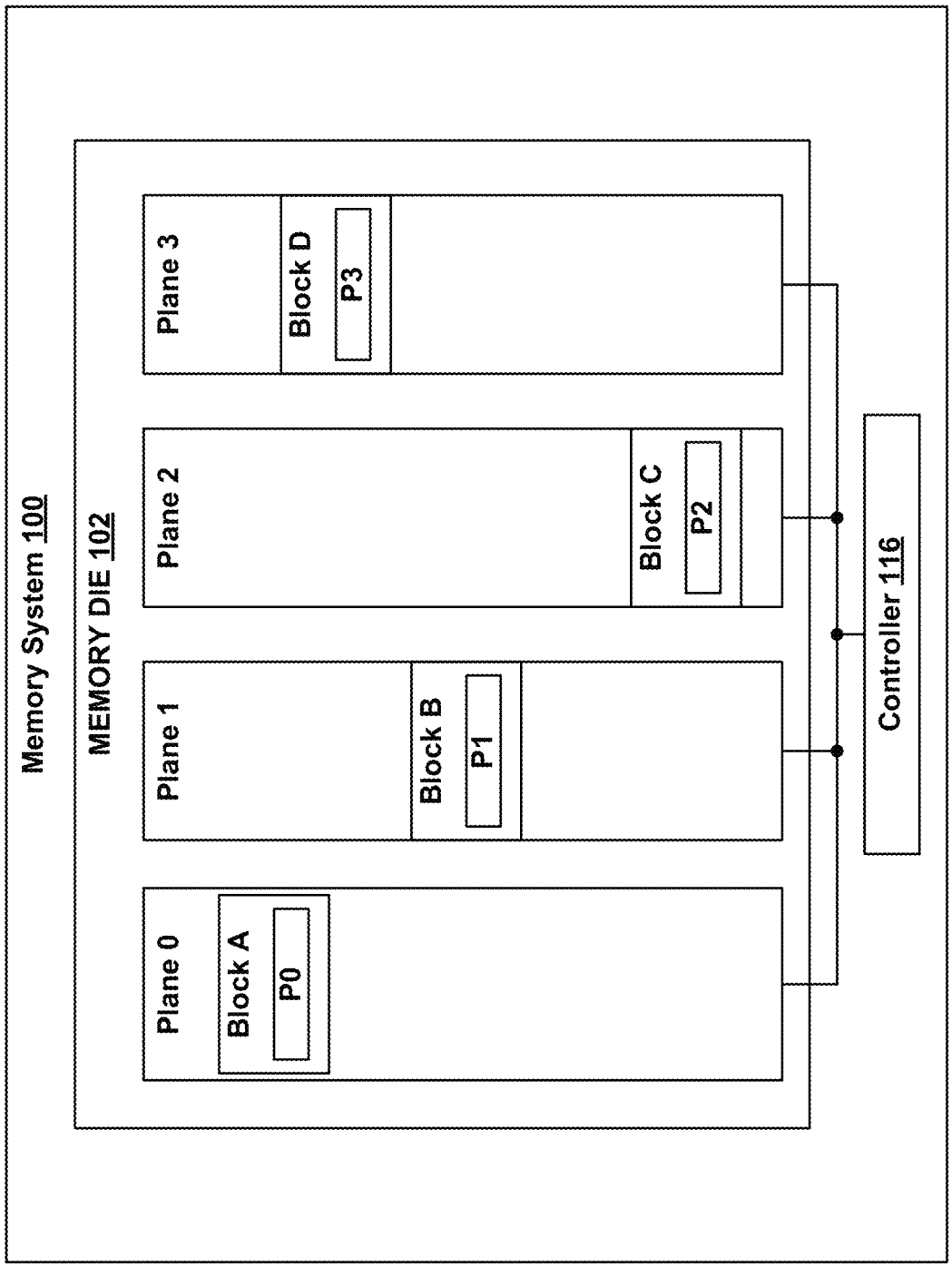
FIG. 4 depicts an embodiment of a flash memory system that includes four memory planes.

FIG. 4 shows another embodiment of memory system 100 that includes a memory die 102 that has four planes, Plane 0, Plane 1, Plane 2 and Plane 3. Persons of ordinary skill in the art will understand that more or fewer than four planes may be used. Each of Planes 0-3 may include multiple blocks. To make the drawing easier to read, only a single block is depicted in each plane. In an embodiment, Plane 0 includes Block A, Plane 1 includes Block B, Plane 2 includes Block C and Plane 3 includes Block D.

Each of Blocks A-D may include multiple pages of data. To make the drawing easier to read, only a single page is depicted in each block. In an embodiment, Block A includes page P0, Block B includes page P1, Block C includes page P2 and Block D includes page P3. In an embodiment, Planes 0-Plane 3 are separately addressed by memory controller 116, and may be read and programmed in parallel.

In an embodiment, a host (e.g., host 118 in FIGS. 1A and 2) issues instructions to flash memory system 100 to access pages in any order. In an embodiment, host 118 issues a series of four read commands (e.g., read page P0, read page P1, read page P2, read page P3) to flash memory system 100, to read pages P0, P1, P2, P3, respectively, in FIG. 4. In an embodiment, host 118 sends the read commands in ascending order, e.g., host 118 sends command read page P0, then sends command read Page P1, then sends command read page P2, and then sends command read page P3.

As described above, input/output operations per second (IOPS) is a performance measurement used to characterize memory systems like hard disk drives, SSDs, and storage area networks. IOPS may be used to measure performance of a memory system. Sequential IOPS access locations on a storage device in a contiguous manner and are generally associated with large data transfer sizes (e.g., 128 kB). Random IOPS access locations on a storage device in a non-contiguous manner and are generally associated with small data transfer sizes (e.g., 4 kB). As used herein, a "random read request" is a read request to access locations on a storage device in a non-contiguous manner.

An example of a random read request is a host requesting only a small chunk of data (e.g., 4 kB) from an SSD. For example, in memory system 100 of FIG. 4, a host may request a small chunk of data that are stored in page P0 of plane 0. As described above, in many systems a page is a unit of reading, and each page includes data stored in all memory cells connected to a common word line. In some systems, each page may store 16 kB of data. Thus, in such a system controller 116 would need to read all 16 kB of page P0 data, identify the requested 4 kB of data within the 16 kB read data, and then provide the identified data to the host.

In some systems (e.g., data centers), random read requests may constitute a substantial majority (e.g., >90%) of the workload. Indeed, in some systems many separate hosts coupled to an SSD may issue random read requests within a very short time period. For example, referring again to memory system 100 of FIG. 4, a first host may request a small chunk of data that is stored in page P0 of Plane 0, a second host may request a small chunk of data that is stored in page P2 of Plane 2, a third host may request a small chunk of data that is stored in page P1 of Plane 1, a fourth host may request a small chunk of data that is stored in page P3 of Plane 3, and so on, all within a short time period.

In each instance, although each random read request may seek 4 kB of data. In the above example, the total amount of requested data is 16 kB (4×4 kB). Nevertheless, controller 116 must read 64 kB (4 pages×16 kB/page) to provide the requested data. If the number of such random requests increases, and the time between the random read requests decreases, the available read processing bandwidth of memory system 100 can very quickly become saturated.

One technique for increasing random read processing bandwidth is to increase the number of planes per memory die, which would increase the number of memory cells that may be read in parallel. One technique for increasing the number of memory cells read in parallel is to increase the number of planes. However, increasing the number of planes increases die size and cost, and may lower die yield.

Technology is described to improve random read processing bandwidth without increasing the number of planes per memory die. In particular, the described technology concurrently reads portions of pages of data from each of separate blocks of memory cells within the same plane.

Figure 5A:
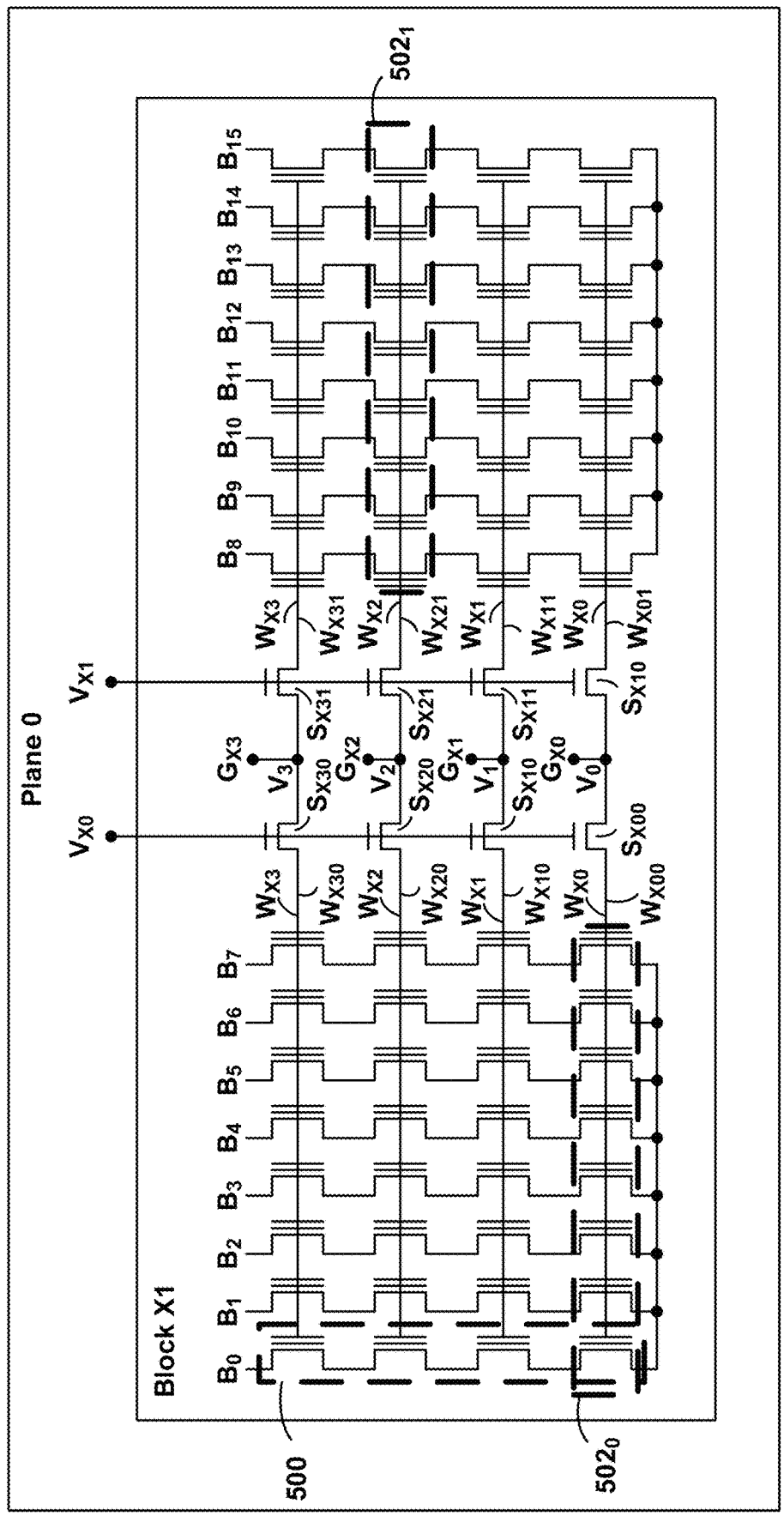
FIG. 5A depicts a plane that includes an embodiment of a block implementing the disclosed technology.

FIG. 5A is a diagram of an embodiment of a plane (Plane 0) that includes a block (Block X1) that contains memory cells arranged in 16 NAND strings (e.g., NAND string 500). For example, Block X1 may be one of the blocks of memory structure 104 of FIGS. 1A-1B. The NAND strings are accessed via bit lines (e.g., bit lines $B_0$-$B_{15}$) and word lines ($W_{X0}$-$W_{X3}$). To make the drawings easier to read, drain select transistors and source select transistors have been omitted. In the illustrated example, each NAND string includes four memory cells. Persons of ordinary skill in the art will understand that each NAND string may include more or fewer than four memory cells. In addition, persons of ordinary skill in the art will understand that Block X1 may include more or fewer than 16 NAND strings, more or fewer than 16 bit lines and more or fewer than 4 word lines.

Each of word lines $W_{X0}$-$W_{X3}$ includes a first word line portion and a second word line portion. In particular, word line $W_{X0}$ includes a first word line portion $W_{X00}$ and a second word line portion $W_{X01}$, word line $W_{X1}$ includes a first word line portion $W_{X20}$ and a second word line portion $W_{X11}$, word line $W_{X2}$ includes a first word line portion $W_{X20}$ and a second word line portion $W_{X21}$, and word line $W_{X3}$ includes a first word line portion $W_{X30}$ and a second word line portion $W_{X31}$.

Each of first word line portions $W_{X00}$, $W_{X10}$, $W_{X20}$ and $W_{X30}$ is coupled to a corresponding first group of memory cells, and each of second word line portions $W_{X01}$, $W_{X11}$, $W_{X21}$ and $W_{X31}$ is coupled to a corresponding second group of memory cells. For example, first word line portion $W_{X00}$ is coupled to a corresponding first group of memory cells $502_0$, and second word line portion $W_{X21}$ is coupled to a corresponding second group of memory cells $502_1$.

In an embodiment, each first group of memory cells is configured to store a corresponding portion of a corresponding page of data, and each second group of memory cells is configured to store a corresponding portion of a corresponding page of data. In an embodiment, each first group of memory cells and each second group of memory cells stores less than a page of data. In an embodiment, each first group of memory cells and each second group of memory cells stores one-half page of data.

Each of first word line portions $W_{X00}$, $W_{X10}$, $W_{X20}$ and $W_{X30}$ also is coupled via a corresponding one of first switches $S_{X00}$-$S_{X30}$ to a corresponding global word line, and each of second word line portions $W_{X01}$, $W_{X11}$, $W_{X21}$ and $W_{X31}$ also is coupled via a corresponding one of second switches $S_{X01}$-$S_{X31}$ to a corresponding global word line.

In an embodiment, each first switch $S_{X00}$-$S_{X30}$ is a transistor (a MOS transistor) that has a first terminal (e.g., a drain or source terminal) coupled to a corresponding one of first word line portions $W_{X00}$-$W_{X30}$, a second terminal (e.g., a source or drain terminal) coupled to a corresponding global word line, and a third terminal (e.g., a gate terminal) coupled to a first control signal $V_{X0}$. Other types of switching devices may be used for first switches $S_{X00}$-$S_{X30}$.

In an embodiment, each second switch $S_{X01}$-$S_{X31}$ is a transistor (a MOS transistor) that has a first terminal (e.g., a drain or source terminal) coupled to a corresponding one of second word line portions $W_{X01}$-$W_{X31}$, a second terminal (e.g., a source or drain terminal) coupled to a corresponding global word line, and a third terminal (e.g., a gate terminal) coupled to a second control signal $V_{X1}$. Other types of switching devices may be used for second switches $S_{X01}$-$S_{X31}$.

In an embodiment, first switch $S_{X00}$ and second switch $S_{X01}$ may be used to selectively couple first word line portion $W_{X00}$ and second word line portion $W_{X01}$ to a first global word line $G_{X0}$, first switch $S_{X10}$ and second switch $S_{X11}$ may be used to selectively couple first word line portion $W_{X10}$ and second word line portion $W_{X11}$ to a second global word line $G_{X1}$, first switch $S_{X20}$ and second switch $S_{X21}$ may be used to selectively couple first word line portion $W_{X20}$ and second word line portion $W_{X21}$ to a third global word line $G_{X2}$, and first switch $S_{X30}$ and second switch $S_{X31}$ may be used to selectively couple first word line portion $W_{X30}$ and second word line portion $W_{X31}$ to a fourth global word line $G_{X3}$.

In an embodiment, a control circuit of memory system 100 of FIG. 1A such as described above may be used to generate first control signal $V_{X0}$ and second control signal $V_{X1}$. In an embodiment, first control signal $V_{X0}$ and second control signal $V_{X1}$ are complementary control signals (e.g., when first control signal $V_{X0}$ is LOW, second control signal $V_{X1}$ is HIGH, and when first control signal $V_{X0}$ is HIGH, second control signal $V_{X1}$ is LOW). In an embodiment, first control signal $V_{X0}$ and second control signal $V_{X1}$ may be used for selectively reading memory cells coupled to one of first word line portions $W_{X00}$-$W_{X30}$ or one of second word line portions $W_{X01}$-$W_{X31}$.

For example, if first control signal $V_{X0}$ is HIGH and second control signal $V_{X1}$ is LOW, and if first global word line $G_{X0}$ is driven to a read voltage ($V_0=V_{rd}$) while global word lines $G_{X1}$, $G_{X2}$, $G_{X3}$ are driven to a pass voltage ($V_1=V_2=V_3=V_{pass}$), the first group of memory cells $502_0$ coupled to first word line portion $W_{X00}$ may be read. In contrast, if first control signal $V_{X0}$ is LOW and second control signal $V_{X1}$ is HIGH, and if third global word line $G_{X2}$ is driven to a read voltage ($V_2=V_{rd}$) while global word lines $G_{X0}$, $G_{X1}$, $G_{X3}$ are driven to a pass voltage ($V_0=V_1=V_3=V_{pass}$), the second group of memory cells $502_1$ coupled to second word line portion $W_{X21}$ may be read.

In an embodiment, first control signal $V_{X0}$ and second control signal $V_{X1}$ may be used for selectively reading less than a page of data from Block X1 of FIG. 5A. In an embodiment, first control signal $V_{X0}$ and second control signal $V_{X1}$ may be used for selectively reading one-half page of data from Block X1. In some systems, each page may store 16 kB of data. Thus, in such systems first control signal $V_{X0}$ and second control signal $V_{X1}$ may be used for selectively reading 8 kB of data from Block X1.

The technology described above and depicted in FIG. 5A may be used to improve random read processing bandwidth without increasing the number of planes per memory die. For example, a host coupled to a memory system (e.g., memory system 100 of any of FIGS. 1A, 2-4) may send first and second random read commands to memory system 100. A control circuit (e.g., controller 116 of FIG. 4) may determine that the first random read command requests data from a first portion of a first page of data from a first block of a plane (e.g., Plane 0 of FIG. 4) and the second random read command requests data from a second portion of a second page of data from a second block of the same plane (e.g., Plane 0 of FIG. 4). Controller 116 also may determine that the first portion and the second portion each are less than a page of data. In such a scenario, controller 116 may be configured to concurrently read the first portion and the second portion.

In an embodiment, the technology described above and depicted in FIG. 5A may be used to concurrently read a first group of memory cells coupled to a first word line portion of a first block in a plane, and read a second group of memory cells coupled to a second word line portion of a second block in the same plane. In an embodiment, the second block is different from the first block. In an embodiment, the first group of memory cells stores a first portion of a first page of data, and the second group of memory cells stores a second portion of a second page of data. In an embodiment, the first group of memory cells stores half of a first page of data, and the second group of memory cells stores half of a second page of data. In an embodiment, the first page and the second page are different pages of different blocks on the same plane.

Figure 5B:
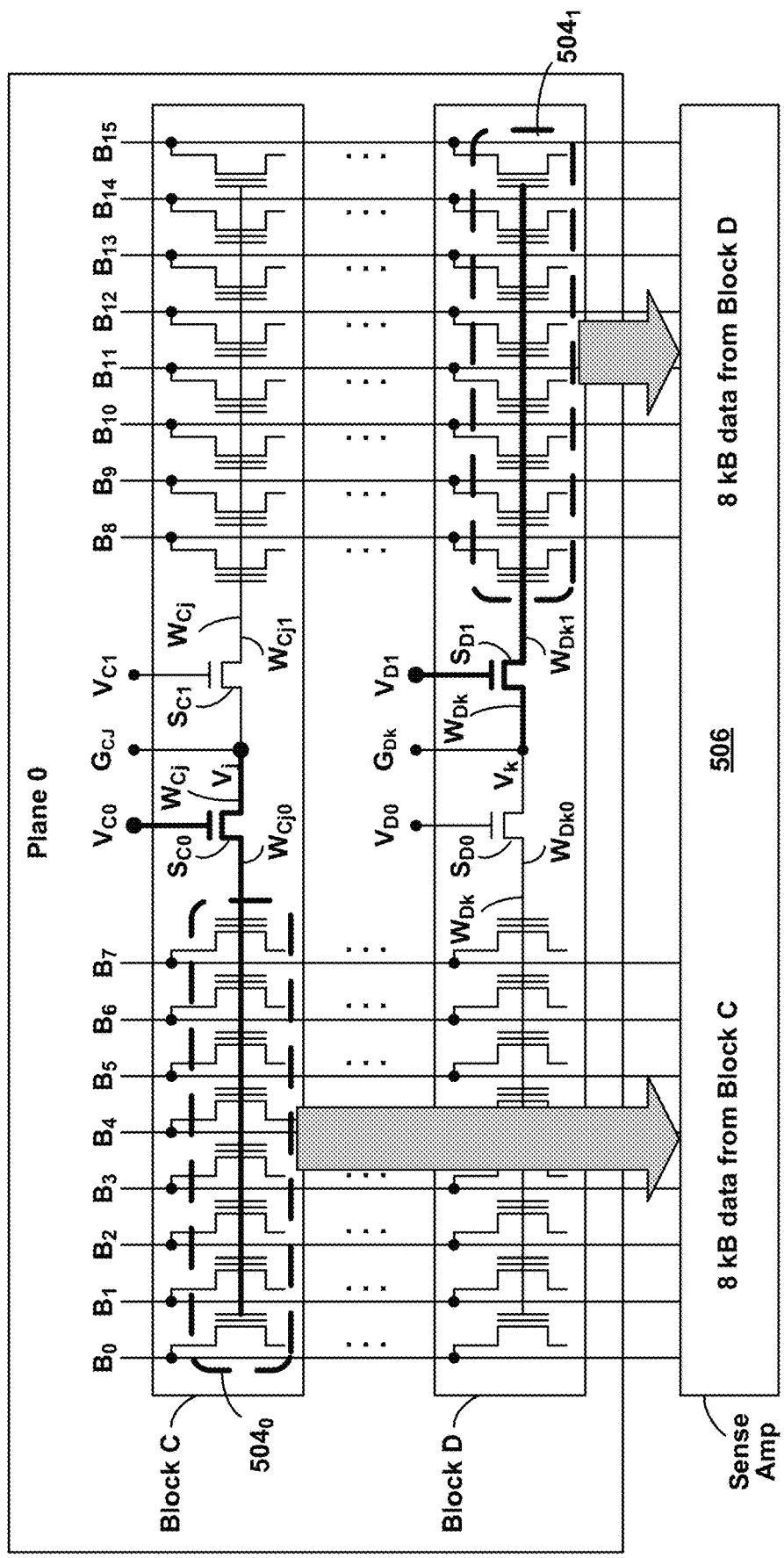
FIG. 5B depicts a plane that includes multiple instances of the example blocks of FIG. 5A.

FIG. 5B is a diagram of a plane (Plane 0) that includes a first block (Block C) and a second block (Block D). Block C and Block D each may be one of Block X1 of FIG. 5A, and may be blocks of memory structure 104 of FIGS. 1A-1B. In an embodiment, Block C and Block D each contain memory cells arranged in 16 NAND strings coupled to a common set of bit lines (e.g., bit lines $B_0$-$B_{15}$), and coupled to multiple word lines. To make the drawing easier to read, a single word line is depicted in each of Block C and Block D. Persons of ordinary skill in the art will understand that Block C and Block D may include more or fewer than 16 NAND strings, and more or fewer than 16 bit lines.

In an embodiment, Block C includes a first word line $W_{Cj}$, and Block D includes a second word line $W_{Dk}$. In an embodiment, first word line $W_{Cj}$ is word line j in Block C and second word line $W_{Dk}$ is word line k in Block D. For example, if j=0 and k=2, first word line $W_{Cj}$ is word line 0 of Block C (comparable to word line $W_{x0}$ of Block X1 of FIG. 5A), and second word line $W_{Dk}$ is word line 2 of Block D (comparable to word line $W_{x2}$ of Block X1 of FIG. 5A).

First word line $W_{Cj}$ includes a first word line portion $W_{Cj0}$ and a second word line portion $W_{Cj1}$, and second word line $W_{Dk}$ includes a first word line portion $W_{Dk0}$ and a second word line portion $W_{Dk1}$. First word line portion $W_{Cj0}$ of first word line $W_{Cj}$ is coupled to a first group of memory cells $504_0$, and second word line portion $W_{Dk1}$ of second word line Wok is coupled to a second group of memory cells $504_1$.

First line portion $W_{Cj0}$ of first word line $W_{Cj}$ is coupled via a first switch $S_{C0}$ to a global word line $G_{Cj}$, and second word line portion $W_{Cj1}$ of first word line $W_{Cj}$ is coupled via a second switch $S_{C1}$ to global word line $G_{Cj}$. First line portion $W_{Dk0}$ of second word line $W_{Dk}$ is coupled via a third switch $S_{D0}$ to global word line $G_{Dk}$, and second word line portion $W_{Dk1}$ of second word line $W_{Dk}$ is coupled via a fourth switch $S_{D1}$ to global word line $GWL_{Dk}$.

In an embodiment, switches $S_{C0}$, $S_{C1}$, $S_{D0}$ and $S_{D1}$ each are transistors (e.g., MOS transistors such as described above regarding FIG. 5A). A gate terminal of first switch $S_{C0}$ is coupled to a first control signal $V_{C0}$, a gate terminal of second switch $S_{C1}$ is coupled to a second control signal $V_{C1}$, a gate terminal of third switch $S_{C1}$ is coupled to a third control signal $V_{D0}$, and a gate terminal of fourth switch $S_{D1}$ is coupled to a fourth control signal $V_{D1}$.

In an embodiment, first switch $S_{C0}$ and second switch $S_{C1}$ may be used to selectively couple first word line portion $W_{Cj0}$ of first word line $W_{Cj}$ and second word line portion $W_{Cj1}$ of first word line $W_{Cj}$, respectively, to global word line $G_{Cj}$, and third switch $S_{D0}$ and fourth switch $S_{D1}$ may be used to selectively couple first word line portion $W_{Dk0}$ of second word line $W_{Dk}$ and second word line portion $W_{Dk1}$ of second word line $W_{Dk}$, respectively, to global word line $G_{Dk}$.

In an embodiment, a control circuit of memory system 100 of FIG. 1A such as described may be used to generate first control signal $V_{C0}$, second control signal $V_{C1}$, third control signal $V_{D0}$, and fourth control signal $V_{D1}$. In an embodiment, first control signal $V_{C0}$ and second control signal $V_{D1}$ are complementary control signals, and third control signal $V_{D0}$ and fourth control signal $V_{D1}$ are complementary control signals. In an embodiment, first control signal $V_{C0}$, second control signal $V_{C1}$, third control signal $V_{D0}$, and fourth control signal $V_{D1}$ may be used for selectively reading memory cells coupled to first word line portion $W_{Cj0}$ of first word line $W_{Cj}$ and second word line portion $W_{Dk1}$ of second word line $W_{Dk}$, or reading memory cells coupled to second word line portion $W_{Cj1}$ of first word line $W_{Cj}$ and first word line portion $W_{Dk0}$ of second word line $W_{Dk}$.

For example, if first control signal $V_{C0}$ is HIGH, second control signal $V_{C1}$ is LOW, third control signal $V_{D0}$ is LOW and fourth control signal $V_{D1}$ is HIGH, and if global word line $G_{Cj}$ is driven to a read voltage ($V_j$=$V_{rd}$), and global word line $GWL_{Dk}$ is driven to a read voltage ($V_k$=$V_{rd}$), the first group of memory cells $504_0$ coupled to first word line portion $W_{Cj0}$ of first word line $W_{Cj}$ and the second group of memory cells $504_1$ coupled to second word line portion $W_{Dk1}$ of second word line $W_{Dk}$ may be concurrently read, such as depicted in FIG. 5B. Persons of ordinary skill in the art will understand that all other first word line portions in Block C and all other second word line portions in Block D are driven to a pass voltage.

In an embodiment, bit lines $B_0$-$B_{15}$ are coupled to a sense amplifier 506 which is an example of a sense amplifier in sense blocks 114 of FIG. 1A. In an embodiment, sense amplifier 506 may be used to determine data states of selected memory cells coupled to bit lines $B_0$-$B_{15}$. As used herein a "selected memory cell" is a memory cell selected for reading. In the example of FIG. 5B, the selected memory cells are first group of memory cells $504_0$ and second group of memory cells $504_1$.

In an embodiment, sense amplifier 506 reads a page of data, and each page stores 16 kB of data. Thus, in the example of FIG. 5B, first control signal $V_{C0}$, second control signal $V_{C1}$, third control signal $V_{D0}$, and fourth control signal $V_{D1}$ are configured so that sense amplifier 506 concurrently reads from first group of memory cells $504_0$ of Block C and from second group of memory cells $504_1$ of Block D. In particular, sense amplifier 506 concurrently reads 8 kB of data from memory cells coupled to first word line portion $W_{Cj0}$ of first word line $W_{Cj}$ of Block C and 8 kB of data from memory cells coupled to second word line portion $W_{Dk1}$ of second word line $W_{Dk}$ of Block D.

Persons of ordinary skill in the art will understand that first control signal $V_{C0}$, second control signal $V_{C1}$, third control signal $V_{D0}$, and fourth control signal $V_{D1}$ alternatively may be configured so that sense amplifier 506 concurrently reads 8 kB of data from memory cells coupled to second word line portion $W_{Cj1}$ of first word line $W_{Cj}$ and 8 kB of data from memory cells coupled to first word line portion $W_{Dk0}$ of second word line $W_{Dk}$ of Block D.

Without wanting to be bound by any particular theory, it is believed that concurrently reading the first portion and the second portion from two separate blocks of the same plane effectively doubles random read processing bandwidth. The technology of FIG. 5B may be applied to multiple planes of a memory die. Thus, without wanting to be bound by any particular theory, it is believed that a four plane memory die may operate like an eight plane memory die in terms of random read bandwidth.

Figure 6A:
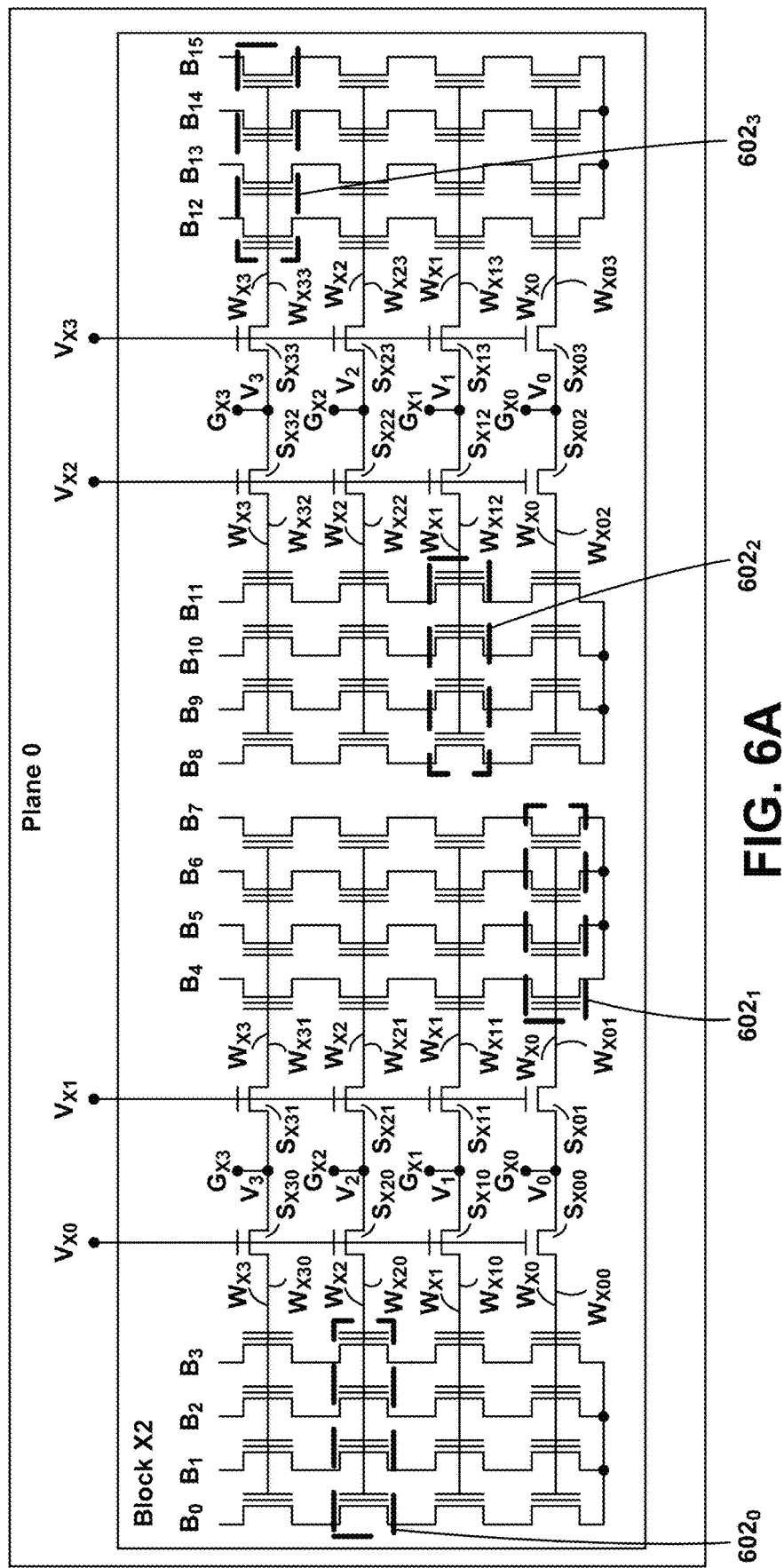
FIG. 6A depicts a plane that includes another embodiment of a block implementing the disclosed technology.

The technology described above and depicted in FIG. 5A can be expanded to selectively reading one of more than two portions of a page of data from a block. In particular, FIG. 6A is a diagram of an embodiment of a plane (Plane 0) that includes a block (Block X2) that contains memory cells arranged in 16 NAND strings (such as NAND string 500 of FIG. 5A). For example, Block X2 may be one of the blocks of memory structure 104 of FIGS. 1A-1B. The NAND strings are accessed via bit lines $B_0$-$B_{15}$ and word lines $W_{X0}$-$W_{X3}$. To make the drawings easier to read, drain select transistors and source select transistors have been omitted.

In the illustrated example, each NAND string includes four memory cells. Persons of ordinary skill in the art will understand that more or fewer than four memory cells can be used in a NAND string. In addition, persons of ordinary skill in the art will understand that Block X2 may include more or fewer than 16 NAND strings, more or fewer than 16 bit lines and more or fewer than 4 word lines.

Each of word lines $W_{X0}$-$W_{X3}$ includes a first word line portion, a second word line portion, a third word line portion and a fourth word line portion. In particular, word line $W_{X0}$ includes a first word line portion $W_{X00}$, a second word line portion $W_{X01}$, a third word line portion $W_{X02}$, and a fourth word line portion $W_{X03}$. Word line $W_{X1}$ includes a first word line portion $W_{X10}$, a second word line portion $W_{X11}$, a third word line portion $W_{X12}$, and a fourth word line portion $W_{X13}$. Word line $W_{X2}$ includes a first word line portion $W_{X20}$, a second word line portion $W_{X21}$, a third word line portion $W_{X22}$, and a fourth word line portion $W_{X23}$. Word line $W_{X3}$ includes a first word line portion $W_{X30}$, a second word line portion $W_{X31}$, a third word line portion $W_{X32}$, and a fourth word line portion $W_{X33}$.

Each of first word line portions $W_{X00}$, $W_{X10}$, $W_{X20}$ and $W_{X30}$ is coupled to a corresponding first group of memory cells, each of second word line portions $W_{X01}$, $W_{X11}$, $W_{X21}$ and $W_{X31}$ is coupled to a corresponding second group of memory cells, each of third word line portions $W_{X02}$, $W_{X12}$, $W_{X22}$ and $W_{X32}$ is coupled to a corresponding third group of memory cells, and each of fourth word line portions $W_{X03}$, $W_{X13}$, $W_{X23}$ and $W_{X33}$ is coupled to a corresponding fourth group of memory cells, For example, first word line portion $W_{X20}$ is coupled to a corresponding first group of memory cells $602_0$, second word line portion $W_{X01}$ is coupled to a corresponding second group of memory cells $602_1$, third word line portion $W_{X12}$ is coupled to a corresponding third group of memory cells $602_2$, and fourth word line portion $W_{X33}$ is coupled to a corresponding fourth group of memory cells $602_3$.

In an embodiment, each first group of memory cells is configured to store a corresponding portion of a corresponding page of data, each second group of memory cells is configured to store a corresponding portion of a corresponding page of data, each third group of memory cells is configured to store a corresponding portion of a corresponding page of data, and each fourth group of memory cells is configured to store a corresponding portion of a corresponding page of data.

In an embodiment, each first group of memory cells, second group of memory cells, third group of memory cells, and fourth group of memory cells stores less than a page of data. In an embodiment, each first group of memory cells, second group of memory cells, third group of memory cells, and fourth group of memory cells stores one-quarter of a page of data.

Each first word line portion $W_{X00}$, $W_{X10}$, $W_{X20}$ and $W_{X30}$ also is coupled via a corresponding one of first switches $S_{X00}$-$S_{X30}$ to a corresponding global word line, each second word line portion $W_{X01}$, $W_{X11}$, $W_{X21}$ and $W_{X31}$ also is coupled via a corresponding one of second switches $S_{X01}$-$S_{X31}$ to a corresponding global word line, each third word line portion $W_{X02}$, $W_{X12}$, $W_{X22}$ and $W_{X32}$ also is coupled via a corresponding one of first switches $S_{X02}$-$S_{X32}$ to a corresponding global word line, and each fourth word line portion $W_{X03}$, $W_{X13}$, $W_{X23}$ and $W_{X33}$ also is coupled via a corresponding one of second switches $S_{X03}$-$S_{X33}$ to a corresponding global word line.

In an embodiment, each first switch $S_{X00}$-$S_{X30}$ is a transistor (a MOS transistor) that has a first terminal (e.g., a drain or source terminal) coupled to a corresponding one of first word line portions $W_{X00}$-$W_{X30}$, a second terminal (e.g., a source or drain terminal) coupled to a corresponding global word line, and a third terminal (e.g., a gate terminal) coupled to a first control signal $V_{X0}$. Other types of switching devices may be used for first switches $S_{X00}$-$S_{X30}$.

In an embodiment, each second switch $S_{X01}$-$S_{X31}$ is a transistor (a MOS transistor) that has a first terminal (e.g., a drain or source terminal) coupled to a corresponding one of second word line portions $W_{X01}$-$W_{X31}$, a second terminal (e.g., a source or drain terminal) coupled to a corresponding global word line, and a third terminal (e.g., a gate terminal) coupled to a second control signal $V_{X1}$. Other types of switching devices may be used for second switches $S_{X01}$-$S_{X31}$.

In an embodiment, each third switch $S_{X02}$-$S_{X32}$ is a transistor (a MOS transistor) that has a first terminal (e.g., a drain or source terminal) coupled to a corresponding one of first word line portions $W_{X02}$-$W_{X32}$, a second terminal (e.g., a source or drain terminal) coupled to a corresponding global word line, and a third terminal (e.g., a gate terminal) coupled to a third control signal $V_{X2}$. Other types of switching devices may be used for third switches $S_{X02}$-$S_{X32}$.

In an embodiment, each fourth switch $S_{X03}$-$S_{X33}$ is a transistor (a MOS transistor) that has a first terminal (e.g., a drain or source terminal) coupled to a corresponding one of first word line portions $W_{X03}$-$W_{X33}$, a second terminal (e.g., a source or drain terminal) coupled to a corresponding global word line, and a third terminal (e.g., a gate terminal) coupled to a third control signal $V_{X3}$. Other types of switching devices may be used for fourth switches $S_{X03}$-$S_{X33}$.

In an embodiment, first switch $S_{X00}$ and second switch $S_{X01}$ may be used to selectively couple first word line portion $W_{X00}$ and second word line portion $W_{X01}$ to global word line $G_{X0}$, and third switch $S_{X02}$ and fourth switch $S_{X03}$ may be used to selectively couple third word line portion $W_{X02}$ and fourth word line portion $W_{X03}$ to global word line $G_{X0}$.

In an embodiment, first switch $S_{X10}$ and second switch $S_{X11}$ may be used to selectively couple first word line portion $W_{X10}$ and second word line portion $W_{X11}$ to global word line $G_{X1}$, and third switch $S_{X12}$ and fourth switch $S_{X13}$ may be used to selectively couple third word line portion $W_{X12}$ and fourth word line portion $W_{X13}$ to global word line $G_{X1}$.

In an embodiment, first switch $S_{X20}$ and second switch $S_{X21}$ may be used to selectively couple first word line portion $W_{X20}$ and second word line portion $W_{X21}$ to global word line $G_{X2}$, and third switch $S_{X22}$ and fourth switch $S_{X23}$ may be used to selectively couple third word line portion $W_{X22}$ and fourth word line portion $W_{X23}$ to global word line $G_{X2}$.

In an embodiment, first switch $S_{X30}$ and second switch $S_{X31}$ may be used to selectively couple first word line portion $W_{X30}$ and second word line portion $W_{X31}$ to global word line $G_{X3}$, and third switch $S_{X32}$ and fourth switch $S_{X33}$ may be used to selectively couple third word line portion $W_{X32}$ and fourth word line portion $W_{X33}$ to global word line $G_{X3}$.

In an embodiment, a control circuit of memory system 100 of FIG. 1A such as described may be used to generate first control signal $V_{X0}$, second control signal $V_{X1}$, third control signal $V_{X2}$, and fourth control signal $V_{X3}$. In an embodiment, first control signal $V_{X0}$ and second control signal $V_{X1}$ are complementary control signals (i.e., when first control signal $V_{X0}$ is LOW, second control signal $V_{X1}$ is HIGH, and when first control signal $V_{X0}$ is HIGH, second control signal $V_{X1}$ is LOW. In an embodiment, third control signal $V_{X2}$ and fourth control signal $V_{X3}$ are complementary control signals (i.e., when third control signal $V_{X2}$ is LOW, fourth control signal $V_{X3}$ is HIGH, and when third control signal $V_{X2}$ is HIGH, fourth control signal $V_{X3}$ is LOW.

In an embodiment, first control signal $V_{X0}$, second control signal $V_{X1}$, third control signal $V_{X2}$, and fourth control signal $V_{X3}$ may be used for selectively reading memory cells coupled to one of first word line portions $W_{X00}$-$W_{X30}$, second word line portions $W_{X01}$-$W_{X31}$, third word line portions $W_{X02}$-$W_{X32}$, or fourth word line portions $W_{X03}$-$W_{X33}$.

For example, if first control signal $V_{X0}$ is HIGH and second control signal $V_{X1}$, third control signal $V_{X2}$ and fourth control signal $V_{X3}$ are all LOW, and if global word line $G_{X2}$ is driven to a read voltage ($V_2=V_{rd}$) while global word line $G_{X0}$, $G_{X1}$, and $G_{X3}$ are driven to a pass voltage ($V_0=V_1=V_3=V_{pass}$), the first group of memory cells $602_0$ coupled to first word line portion $W_{X30}$ may be read.

Alternatively, if second control signal $V_{X1}$ is HIGH and first control signal $V_{X0}$, third control signal $V_{X2}$ and fourth control signal $V_{X3}$ are all LOW, and if global word line $G_{X0}$ is driven to a read voltage ($V_0=V_{rd}$) while global word lines $G_{X1}$, $G_{X2}$, and $G_{X3}$ are driven to a pass voltage ($V_1=V_2=V_3=V_{pass}$), the second group of memory cells $602_1$ coupled to second word line portion $W_{X01}$ may be read.

In contrast, if third control signal $V_{X2}$ is HIGH and first control signal $V_{X0}$, second control signal $V_{X1}$ and fourth control signal $V_{X3}$ are all LOW, and if global word line $G_{X1}$ is driven to a read voltage ($V_1=V_{rd}$) while global word lines $G_{X0}$, $G_{X2}$, and $G_{X3}$ are driven to a pass voltage ($V_0=V_2=V_3=V_{pass}$), the third group of memory cells $602_2$ coupled to third word line portion $W_{X12}$ may be read.

Alternatively, if fourth control signal $V_{X3}$ is HIGH and first control signal $V_{X0}$, second control signal $V_{X1}$ and third control signal $V_{X2}$ are all LOW, and if global word line $G_{X3}$ is driven to a read voltage ($V_3=V_{rd}$) while global word lines $G_{X0}$, $G_{X1}$, and $G_{X2}$ are driven to a pass voltage ($V_0=V_1=V_2=V_{pass}$), the fourth group of memory cells $602_3$ coupled to fourth word line portion $W_{X33}$ may be read.

In an embodiment, first control signal $V_{X0}$, second control signal $V_{X1}$, third control signal $V_{X2}$ and fourth control signal $V_{X3}$ may be used for selectively reading less than a page of data from Block X2 of FIG. 6A. In an embodiment, first control signal $V_{X0}$, second control signal $V_{X1}$, third control signal $V_{X2}$ and fourth control signal $V_{X3}$ may be used for selectively reading one quarter page of data from Block X2. In some systems, each page may store 16 kB of data. Thus, in such systems first control signal $V_{X0}$, second control signal $V_{X1}$, third control signal $V_{X2}$ and fourth control signal $V_{X3}$ may be used for selectively reading 4 kB of data from Block X2.

The technology described above and depicted in FIG. 6A may be used to improve random read processing bandwidth without increasing the number of planes per memory die. For example, a host coupled to a memory system (e.g., memory system 100 of any of FIGS. 1A, 2-4) may send first, second, third and fourth random read commands to memory system 100. A control circuit (e.g., controller 116 of FIG. 4) may determine that the first random read command requests data from a first portion of a first page of data from a first block of a plane (e.g., Plane 0 of FIG. 4), the second random read command requests data from a second portion of a second page of data from a second block of the same plane, the third random read command requests data from a third portion of a third page of data from a third block of the same plane, and the fourth random read command requests data from a fourth portion of a fourth page of data from a fourth block of the same plane. Controller 116 also may determine that the first portion, second portion, third portion and fourth portion each are less than a page of data. In such a scenario, controller 116 may be configured to concurrently read the first portion, the second portion, the third portion and the fourth portion.

In an embodiment, the technology described above may be used to concurrently read less than a page of data from each of several blocks in a same plane. In an embodiment, the technology may be used to concurrently read a first group of memory cells coupled to a first word line portion of a first block in a plane, a second group of memory cells coupled to a second word line portion of a second block in the same plane, a third group of memory cells coupled to a third word line portion of a third block in a plane, and a fourth group of memory cells coupled to a fourth word line portion of a fourth block in the same plane.

In an embodiment, the first block, second block, third block and fourth block are all different blocks. In an embodiment, the first group of memory cells stores a first portion of a first page of data, the second group of memory cells stores a second portion of a second page of data, the third group of memory cells stores a third portion of a third page of data, and the fourth group of memory cells stores a fourth portion of a fourth page of data.

In an embodiment, the first group of memory cells stores one quarter of a first page of data, the second group of memory cells stores one quarter of a second page of data, the third group of memory cells stores one quarter of a third page of data, and the fourth group of memory cells stores one quarter of a fourth page of data. In an embodiment, the first page, second page, third page and fourth page are different pages of different blocks in the same plane.

Figure 6B:
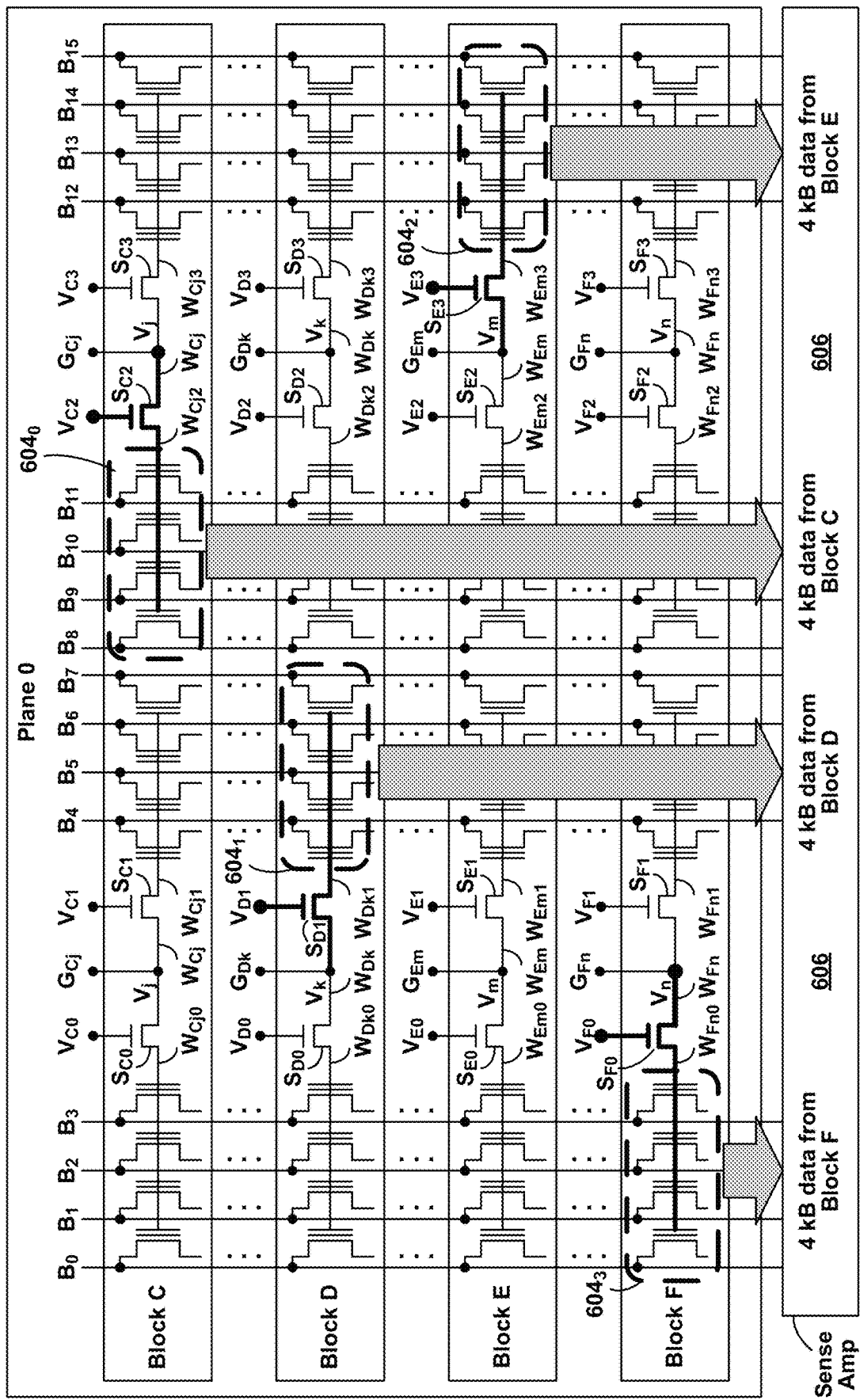
FIG. 6B depicts a plane that includes multiple instances of the example blocks of FIG. 6A.

FIG. 6B is a diagram of a plane (Plane 0) that includes a first block (Block C), a second block (Block D), a third block (Block E) and a fourth block (Block F). Blocks C-E each may be one of Block X2 of FIG. 6A, and may be blocks of memory structure 104 of FIGS. 1A-1B. In an embodiment, Blocks C-E each contain memory cells arranged in 16 NAND strings coupled to a common set of bit lines (e.g., bit lines $B_0$-$B_{15}$), and coupled to multiple word lines. To make the drawing easier to read, a single word line is depicted in each of Blocks C-E. Persons of ordinary skill in the art will understand that Blocks C-E may include more or fewer than 16 NAND strings, and more or fewer than 16 bit lines.

In an embodiment, Block C includes a first word line $W_{Cj}$, Block D includes a second word line $W_{Dk}$, Block E includes a third word line $W_{Em}$, and Block D includes a fourth word line $W_{Fn}$. In an embodiment, first word line $W_{Cj}$ is word line j in Block C, second word line $W_{Dk}$ is word line k in Block D, third word line $W_{Em}$ is word line m in Block E, and fourth word line $W_{Fn}$ is word line n in Block F.

For example, if j=0, k=2, m=1, and n=3, first word line $W_{Cj}$ is word line 0 of Block C (comparable to word line $W_{X0}$ of Block X2 of FIG. 6A), second word line $W_{Dk}$ is word line 2 of Block D (comparable to word line $W_{X2}$ of Block X2 of FIG. 6A), third word line $W_{Em}$ is word line 1 of Block E (comparable to word line $W_{X1}$ of Block X2 of FIG. 6A), and fourth word line $W_{Fn}$ is word line 3 of Block F (comparable to word line $W_{X3}$ of Block X2 of FIG. 6A).

First word line $W_{Cj}$ includes a first word line portion $W_{Cj0}$, a second word line portion $W_{Cj1}$, a third word line portion $W_{Cj2}$, and a fourth word line portion $W_{Cj3}$. Second word line $W_{Dk}$ includes a first word line portion $W_{Dk0}$, a second word line portion $W_{Dk1}$, a third word line portion $W_{Dk2}$, and a fourth word line portion $W_{Dk3}$. Third word line $W_{Em}$ includes a first word line portion $W_{Em0}$, a second word line portion $W_{Em1}$, a third word line portion $W_{Em2}$, and a fourth word line portion $W_{Em3}$. Fourth word line $W_{Fn}$ includes a first word line portion $W_{Fn0}$, a second word line portion $W_{Fn1}$, a third word line portion $W_{Fn2}$, and a fourth word line portion $W_{Fn3}$.

Third word line portion $W_{Cj2}$ of first word line $W_{Cj}$ is coupled to a first group of memory cells 604$_0$, second word line portion $W_{Dk1}$ of second word line $W_{Dk}$ is coupled to a second group of memory cells 604$_1$, fourth word line portion $W_{Em3}$ of third word line $W_{Em}$ is coupled to a third group of memory cells 604$_2$, and first word line portion $W_{Fn0}$ of fourth word line $W_{Fn}$ is coupled to a fourth group of memory cells 604$_3$.

First word line portion $W_{Cj0}$ of first word line $W_{Cj}$ is coupled via a first switch $S_{C0}$ to global word line $G_{Cj}$, second word line portion $W_{Cj1}$ of first word line $W_{Cj}$ is coupled via a second switch $S_{C1}$ to global word line $G_{Cj}$, third word line portion $W_{Cj2}$ of first word line $W_{Cj}$ is coupled via a third switch $S_{C2}$ to global word line $G_{Cj}$, and fourth word line portion $W_{Cj3}$ of first word line $W_{Cj}$ is coupled via a fourth switch $S_{C3}$ to global word line $G_{Cj}$.

First word line portion $W_{Dk0}$ of second word line $W_{Dk}$ is coupled via a fifth switch $S_{D0}$ to global word line $G_{Dk}$, second word line portion $W_{Dk1}$ of second word line $W_{Dk}$ is coupled via a sixth switch $S_{D1}$ to global word line $G_{Dk}$, third word line portion $W_{Dk2}$ of second word line $W_{Dk}$ is coupled via a seventh switch $S_{D2}$ to global word line $G_{Dk}$ and fourth word line portion $W_{Dk3}$ of second word line $W_{Dk}$ is coupled via an eighth switch $S_{D3}$ to global word line $G_{Dk}$.

First word line portion $W_{Em0}$ of third word line $W_{Em}$ is coupled via a ninth switch $SE_0$ to global word line $G_{Em}$, second word line portion $W_{Em1}$ of third word line $W_{Em}$ is coupled via a tenth switch $SE_1$ to global word line $G_{Em}$, third word line portion $W_{Em2}$ of third word line $W_{Em}$ is coupled via an eleventh switch $SE_2$ to global word line $G_{Em}$, and fourth word line portion $W_{Em3}$ of third word line $W_{Em}$ is coupled via a twelfth switch $SE_3$ to global word line $G_{Em}$.

First word line portion $W_{Fn0}$ of fourth word line $W_{Fn}$ is coupled via a thirteenth switch $SF_0$ to global word line $G_{Fn}$, second word line portion $W_{Fn1}$ of fourth word line $W_{Fn}$ is coupled via a fourteenth switch $SF_1$ to global word line $G_{Fn}$, third word line portion $W_{Fn2}$ of fourth word line $W_{Fn}$ is coupled via a fifteenth switch $SF_2$ to global word line $G_{Fn}$, and fourth word line portion $W_{Fn3}$ of fourth word line $W_{Fn}$ is coupled via a sixteenth switch $SF_3$ to global word line $G_{Fn}$.

In an embodiment, switches $S_{C0}$-$S_{C3}$, $S_{D0}$-$S_{D3}$, $S_{E0}$-$S_{E3}$, and $S_{F0}$-$S_{F3}$ each are transistors (e.g., MOS transistors such as described above regarding FIG. 6A). A gate terminal of first switch $S_{C0}$ is coupled to a first control signal $V_{C0}$, a gate terminal of second switch $S_{C1}$ is coupled to a second control signal $V_{C1}$, a gate terminal of third switch $S_{C2}$ is coupled to a third control signal $V_{C2}$, and a gate terminal of fourth switch $S_{C3}$ is coupled to a fourth control signal $V_{C3}$.

A gate terminal of fifth switch $S_{D0}$ is coupled to a fifth control signal $V_{D0}$, a gate terminal of sixth switch $S_{D1}$ is coupled to a sixth control signal $V_{D1}$, a gate terminal of seventh switch $S_{D2}$ is coupled to a seventh control signal $V_{D2}$, and a gate terminal of eighth switch $S_{D3}$ is coupled to an eighth control signal $V_{D3}$.

A gate terminal of ninth switch $SE_0$ is coupled to a ninth control signal $V_{E0}$, a gate terminal of tenth switch $SE_1$ is coupled to a tenth control signal $V_{E1}$, a gate terminal of eleventh switch $SE_2$ is coupled to an eleventh control signal $V_{E2}$, and a gate terminal of twelfth switch $SE_3$ is coupled to a twelfth control signal $V_{E3}$.

A gate terminal of thirteenth switch $S_{F0}$ is coupled to a thirteenth control signal $V_{F0}$, a gate terminal of fourteenth switch $SF_1$ is coupled to a fourteenth control signal $V_{F1}$, a gate terminal of fifteenth switch $SF_2$ is coupled to a fifteenth control signal $V_{F2}$, and a gate terminal of sixteenth switch $SF_3$ is coupled to a sixteenth control signal $V_{F3}$.

In an embodiment, first switch $S_{C0}$, second switch $S_{C1}$, third switch $S_{C2}$, and fourth switch $S_{C3}$ may be used to selectively couple first word line portion $W_{Cj0}$ of first word line $W_{Cj}$, second word line portion $W_{Cj1}$ of first word line $W_{Cj}$, third word line portion $W_{Cj2}$ of first word line $W_{Cj}$, and fourth word line portion $W_{Cj3}$ of first word line $W_{Cj}$, respectively, to global word line $G_{Cj}$.

In an embodiment, fifth switch $S_{D0}$, sixth switch $S_{D1}$, seventh switch $S_{D2}$, and eighth switch $S_{D3}$ may be used to selectively couple first word line portion $W_{Dk0}$ of second word line $W_{Dk}$, second word line portion $W_{Dk1}$ of second word line $W_{Dk}$, third word line portion $W_{Dk2}$ of second word line $W_{Dk}$, and fourth word line portion $W_{Dk3}$ of second word line $W_{Dk}$, respectively, to global word line $G_{Dk}$.

In an embodiment, ninth switch $S_{E0}$, tenth switch $S_{E1}$, eleventh switch $S_{E2}$, and twelfth switch $S_{E3}$ may be used to selectively couple first word line portion $W_{Em0}$ of third word line $W_{Em}$, second word line portion $W_{Em1}$ of third word line $W_{Em}$, third word line portion $W_{Em2}$ of third word line $W_{Em}$, and fourth word line portion $W_{Em3}$ of third word line $W_{Em}$, respectively, to global word line $G_{Em}$.

In an embodiment, thirteenth switch $S_{F0}$, fourteenth switch $S_{F1}$, fifteenth switch $S_{F2}$, and sixteenth switch $S_{F3}$ may be used to selectively couple first word line portion $W_{Fn0}$ of fourth word line $W_{Fn}$, second word line portion $W_{Fn1}$ of fourth word line $W_{Fn}$, third word line portion $W_{Fn2}$ of fourth word line $W_{Fn}$, and fourth word line portion $W_{Fn3}$ of fourth word line $W_{Fn}$, respectively, to global word line $G_{Fn}$.

In an embodiment, a control circuit of memory system 100 of FIG. 1A such as described may be used to generate control signals $V_{C0}$-$V_{C3}$, $V_{D0}$-$V_{D3}$, $V_{E0}$-$V_{E3}$, and $V_{E0}$-$V_{E3}$. In an embodiment, when any one of first control signal $V_{C0}$, second control signal $V_{C1}$, third control signal $V_{C2}$, and fourth control signal $V_{C3}$ are HIGH, the other three control signals are LOW. In an embodiment, when any one of fifth control signal $V_{C0}$, sixth control signal $V_{D1}$, seventh control signal $V_{D2}$, and eighth control signal $V_{D3}$ are HIGH, the other three control signals are LOW. In an embodiment, when any one of ninth control signal $V_{E0}$, tenth control signal $V_{E1}$, eleventh control signal $V_{E2}$, and twelfth control signal $V_{E3}$ are HIGH, the other three control signals are LOW. In an embodiment, when any one of thirteenth control signal $V_{E0}$, fourteenth control signal $V_{E1}$, fifteenth control signal $V_{E2}$, and sixteenth control signal $V_{E3}$ are HIGH, the other three control signals are LOW.

In an embodiment, control signals $V_{C0}$-$V_{F3}$ may be used for selectively reading memory cells coupled to a unique word line portion from each of first word line $W_{Cj}$, second word line $W_{Dk}$, third word line $W_{Em}$ and fourth word line $W_{Fn}$. That is, if a particular word line portion is read from one of first word line $W_{Cj}$, second word line $W_{Dk}$, third word line $W_{Em}$ and fourth word line $W_{Fn}$ (e.g., first word line portion of fourth word line $W_{Fn}$), the word line portions that are read from the other three word lines must be other than the particular word line portion.

For example, if control signals $V_{F0}$, $V_{D1}$, $V_{C2}$ and $V_{E3}$ are all HIGH, and all other control signals are LOW, and if global word line $G_{Fn}$, global word line $G_{Dk}$, global word line $G_{Cj}$ and global word line $G_{Em}$ are all driven to a read voltage ($V_n = V_k = V_j = V_m = V_{rd}$), while all other global word lines are driven to a pass voltage, the first group of memory cells $604_0$ coupled to third word line portion $W_{Cj2}$ of first word line $W_{Cj}$, the second group of memory cells $604_1$ coupled to second word line portion $W_{Dk1}$ of second word line $W_{Dk}$, the third group of memory cells $604_2$ coupled to fourth word line portion $W_{Em3}$ of third word line $W_{Em}$, and the fourth group of memory cells $604_3$ coupled to first word line portion $W_{Fn0}$ of fourth word line $W_{Fn}$ may be concurrently read, such as depicted in FIG. 6B. Persons of ordinary skill in the art will understand that all other third word line portions in Block C, all other second word line portions in Block D, all other fourth word line portions in Block E, and all other first word line portions in Block F are driven to a pass voltage.

In an embodiment, bit lines $B_0$-$B_{15}$ are coupled to a sense amplifier 606 which is an example of a sense amplifier in sense blocks 114 of FIG. 1A. In an embodiment, sense amplifier 606 may be used to determine data states of selected memory cells coupled to bit lines $B_0$-$B_{15}$. In the example of FIG. 6B, the selected memory cells are first group of memory cells $604_0$, second group of memory cells $604_1$, third group of memory cells $604_2$, and fourth group of memory cells $604_3$.

In an embodiment, sense amplifier 606 reads a page of data, and each page stores 16 kB of data. Thus, in the example of FIG. 6B, $V_{F0}$, $V_{D1}$, $V_{C2}$ and $V_{E3}$ are configured so that sense amplifier 606 concurrently reads from first group of memory cells $604_0$ of Block C, second group of memory cells $604_1$ of Block D, third group of memory cells $604_2$ of Block E, and fourth group of memory cells $604_3$ of Block F. In particular, sense amplifier 606 concurrently reads 4 kB of data from memory cells coupled to first word line portion $W_{Fn0}$ of fourth word line $W_{Fn}$ of Block F, 4 kB of data from memory cells coupled to second word line portion $W_{Dk1}$ of second word line $W_{Dk}$ of Block D, 4 kB of data from memory cells coupled to third word line portion $W_{Cj2}$ of first word line $W_{Cj}$ of Block C, and 4 kB of data from memory cells coupled to fourth word line portion $W_{Em3}$ of third word line $W_{Em}$ of Block E.

Persons of ordinary skill in the art will understand that control signals $V_{C0}$-$V_{F3}$ may be configured so that sense amplifier 606 concurrently reads 4 kB of data from memory cells coupled to other word line portions first word line $W_{Cj}$ of Block C, second word line $W_{Dk}$ of Block D, third word line $W_{Em}$ of Block E and fourth word line $W_{Fn}$ of block F.

Without wanting to be bound by any particular theory, it is believed that concurrently reading four portions from four separate blocks of the same plane effectively quadruples random read processing bandwidth. The technology of FIG. 6B may be applied to multiple planes of a memory die. Thus, without wanting to be bound by any particular theory, it is believed that a four plane memory die may operate like a sixteen plane memory die in terms of random read bandwidth.

One embodiment includes an apparatus that includes a control circuit and a plurality of non-volatile memory cells arranged in a plane of a memory die. The plane includes a first word line and a second word line. The first word line includes a first word line portion coupled to a corresponding first group of the non-volatile memory cells. The second word line includes a second word line portion coupled to a corresponding second group of the non-volatile memory cells. The second word line is different from the first word line. The control circuit is configured to apply a first voltage to the first word line portion and apply a second voltage to the second word line portion to concurrently read the first group of the non-volatile memory cells and the second group of the non-volatile memory cells. The first group of the non-volatile memory cells and the second group of the non-volatile memory cells each store less than a page of data.

One embodiment includes a method including receiving a first random read command and a second random read command, determining that the first random read command requests data from a first portion of a first page of data from a first block of a plane of a memory die, determining that the second random read command requests data from a second portion of a second page of data from a second block of the plane of the memory die, the second block different from the first block, determining that the first portion and the second portion each comprise less than a page of data, and concurrently reading the first portion and the second portion.

One embodiment includes a system that includes a plurality of non-volatile memory cells arranged in a plane of a memory die, the plane comprising a first page of data in a first block and a second page of data in a second block different from the first block, and a control circuit coupled to the plurality of non-volatile memory cells, the control circuit configured to concurrently read a first portion of the first page of data and a second portion of the second page of data. The first portion and the second portion collectively comprise a page of data.

The means for means for iteratively forming and executing a plurality of read sets can be implemented by a microprocessor, microcontroller, state machine, FPGA or other type of processor in combination with decoders, sense amplifiers, voltage and current sources and other control logic performing the process of FIG. 11. For example, the means for iteratively forming and executing a plurality of read sets may include control circuitry 106, decoders 110/112, read/write circuits 108, controller 116 and processor 802 of FIGS. 1A, 2 and 8A performing the process of FIG. 11. In some embodiments, the means for iteratively forming and executing a plurality of read sets may include controller 116 and processor 802 performing the processes of FIG. 11 with or without support from the circuits on the memory die (e.g., memory die 102 of FIG. 1A).

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects. For example, the terms "first" and "second" in the phrases first register and second register are used as identification labels to distinguish the register and are not meant to indicate an order or priority.

For purposes of this document, the term "set" of objects may refer to a "set" of one or more of the objects.

The foregoing detailed description has been presented for purposes of illustration and description, and is not intended to be exhaustive or to limit to the precise form disclosed. Many modifications and variations are possible in light of the above teaching. The described embodiments were chosen to best explain the principles and practical application of the disclosed technology, to thereby enable others skilled in the art to best utilize the technology in various embodiments and with various modifications as are suited to the particular use contemplated. The scope of the disclosed technology is defined by the appended claims.

The invention claimed is:

1. An apparatus comprising:
a plurality of non-volatile memory cells arranged in a plane of a memory die, the plane comprising:
a first word line comprising a first word line portion coupled to a corresponding first group of the non-volatile memory cells;
a second word line comprising a second word line portion coupled to a corresponding second group of the non-volatile memory cells, the second word line different from the first word line; and
a control circuit configured to apply a first voltage to the first word line portion and apply a second voltage to the second word line portion to concurrently read the first group of the non-volatile memory cells and the second group of the non-volatile memory cells,
wherein the first group of the non-volatile memory cells and the second group of the non-volatile memory cells each store less than a page of data.

2. The apparatus of claim 1, wherein the first word line and the second word line are each coupled to non-volatile memory cells configured to store a page of data.

3. The apparatus of claim 1, wherein the plane further comprises a first block of the non-volatile memory cells comprising the first word line, and a second block of the non-volatile memory cells comprising the second word line, the second block different from the first block.

4. The apparatus of claim 1, wherein the first group of the non-volatile memory cells store a first portion of a first page of data, and the second group of the non-volatile memory cells store a second portion of a second page of data.

5. The apparatus of claim 1, wherein the first group of the non-volatile memory cells store half a page of data, and the second group of the non-volatile memory cells store half a page of data.

6. The apparatus of claim 1, wherein the first group of the non-volatile memory cells store one quarter of a page of data, and the second group of the non-volatile memory cells store one quarter of a page of data.

7. The apparatus of claim 1, wherein:
the plane further comprises:
a third word line comprising a third word line portion coupled to a third group of the non-volatile memory cells;
a fourth word line comprising a fourth word line portion coupled to a fourth group of the non-volatile memory cells, the fourth word line different from the third word line; and
the control circuit is further configured to apply a third voltage to the third word line portion and apply a fourth voltage to the fourth word line portion to concurrently read data from the third group of the non-volatile memory cells and the fourth group of the non-volatile memory cells,
wherein the third group of the non-volatile memory cells and the fourth group of the non-volatile memory cells each store less than a page of data.

8. The apparatus of claim 7, wherein the third word line and the fourth word line are each coupled to non-volatile memory cells configured to store a page of data.

9. The apparatus of claim 7, wherein the plane further comprises a first block of the non-volatile memory cells comprising the first word line, a second block of the non-volatile memory cells comprising the second word line, a third block of the non-volatile memory cells comprising the third word line, and a fourth block of the non-volatile memory cells comprising the fourth word line, wherein the first block, second block, third block and fourth block are all different blocks.

10. The apparatus of claim 7, wherein the first group of the non-volatile memory cells store one quarter of a first page of data, the second group of the non-volatile memory cells store one quarter of a second page of data, the third group of the non-volatile memory cells store one quarter of a third page of data, and the fourth group of the non-volatile memory cells store one quarter of a fourth page of data, wherein the first page, second page, third page and fourth page are all different pages.

11. A method comprising:
receiving a first random read command and a second random read command;
determining that the first random read command requests data from a first portion of a first page of data from a first block of a plane of a memory die;
determining that the second random read command requests data from a second portion of a second page of data from a second block of the plane of the memory die, the second block different from the first block;
determining that the first portion and the second portion each comprise less than a page of data; and
concurrently reading the first portion and the second portion.

12. The method of claim 11, wherein:
the first page of data comprises a first word line of the first block;

the second page of data comprises a second word line of the second block; and concurrently reading comprises applying a first voltage to the first word line portion and a second voltage to the second word line portion.

13. The method of claim 11, wherein the first portion comprises half of the first page of data, and the second portion comprises half of the second page of data.

14. The method of claim 11, wherein concurrently reading comprises using a single sense amplifier to concurrently read the first portion and the second portion.

15. The method of claim 11, further comprising:

receiving a third random read command and a fourth random read command;

determining that the third random read command requests data from a third portion of a third page of data from a third block of the plane of the memory die;

determining that the fourth random read command requests data from a fourth portion of a fourth page of data from a fourth block of the plane of the memory die, the third block different from the fourth block;

determining that the third portion and the fourth portion each comprise less than a page of data; and concurrently reading the first portion, the second portion, the third portion and the fourth portion.

16. The method of claim 15, wherein:

the third page of data comprises a third word line of the third block;

the fourth page of data comprises a fourth word line of the fourth block; and concurrently reading further comprises applying a third voltage to the third word line portion and a fourth voltage to the fourth word line portion.

17. The method of claim 15, wherein the first portion comprises a quarter of the first page of data, the second portion comprises a quarter of the second page of data, the third portion comprises a quarter of the third page of data, and the fourth portion comprises a quarter of the fourth page of data.

18. The method of claim 15, wherein concurrently reading comprises using a single sense amplifier to concurrently read the first portion, the second portion, the third portion and the fourth portion.

19. An apparatus comprising:

a plurality of non-volatile memory cells arranged in a plane of a memory die, the plane comprising a first page of data in a first block and a second page of data in a second block different from the first block; and a control circuit coupled to the plurality of non-volatile memory cells, the control circuit configured to concurrently read a first portion of the first page of data and a second portion of the second page of data, wherein the first portion and the second portion collectively comprise a page of data.

20. The apparatus of claim 19, wherein:

the plane further comprises a third page of data in a third block and a fourth page of data in a fourth block different from the third block; and the control circuit is further configured to concurrently read a third portion of the third page of data, and a fourth portion of the fourth page of data, wherein the first portion, the second portion, the third portion and the fourth portion collectively comprise a page of data.

* * * * *